(12) United States Patent
Park et al.

(10) Patent No.: US 12,501,759 B2
(45) Date of Patent: Dec. 16, 2025

(54) DISPLAY DEVICE

(71) Applicant: Samsung Display Co., LTD., Yongin-si (KR)

(72) Inventors: Do Yeong Park, Yongin-si (KR); Chong Chul Chai, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 625 days.

(21) Appl. No.: 17/739,325

(22) Filed: May 9, 2022

(65) Prior Publication Data

US 2023/0006116 A1 Jan. 5, 2023

(30) Foreign Application Priority Data

Jul. 5, 2021 (KR) .................. 10-2021-0088075

(51) Int. Cl.
*H10H 29/49* (2025.01)
*H10H 29/14* (2025.01)
*H10H 29/32* (2025.01)
*H10H 29/34* (2025.01)
*H01L 25/075* (2006.01)
*H01L 25/16* (2023.01)

(52) U.S. Cl.
CPC .......... *H10H 29/49* (2025.01); *H10H 29/142* (2025.01); *H10H 29/32* (2025.01);
(Continued)

(58) Field of Classification Search
CPC . H01L 27/124; H01L 27/1255; H01L 27/156; H01L 25/0753; H01L 25/167; H10H 29/49; H10H 29/142; H10H 29/32; H10H 29/34; H10H 20/857; H10H 29/011; H10H 29/14; H10H 29/30; H10H 29/345; H10H 29/352; H10H 29/362; H10H 29/37; H10H 29/39; H10H 29/41; H10H 29/45; H10H 29/8517; H10H 29/8552;
(Continued)

(56) References Cited

U.S. PATENT DOCUMENTS 10,249,603 B2    4/2019   Cho et al.
10,276,630 B2    4/2019   Lee et al.
(Continued)

FOREIGN PATENT DOCUMENTS

JP        2020-67662         4/2020
KR    10-2013-0128146       11/2013
(Continued)

OTHER PUBLICATIONS

International Search Report corresponding to International Application No. PCT/KR2022/009613 dated Oct. 11, 2022.

*Primary Examiner* — Ratisha Mehta
*Assistant Examiner* — Brad A Knudson
(74) *Attorney, Agent, or Firm* — Womble Bond Dickinson (US) LLP

(57) ABSTRACT

A display device includes pixels, each of the pixels including light emitting parts disposed in a first direction; pixel circuits including storage capacitors disposed in a second direction intersecting the first direction; a scan line extending in the first direction between the storage capacitors; a sub-scan line electrically connected to the scan line and extending in the second direction; and connection lines that electrically connect the light emitting parts and the pixel circuits and do not overlap the sub-scan line in a plan view.

22 Claims, 16 Drawing Sheets

(52) U.S. Cl.
CPC ......... *H10H 29/34* (2025.01); *H01L 25/0753* (2013.01); *H01L 25/167* (2013.01)

(58) Field of Classification Search
CPC .. H10H 29/922; H10H 29/942; H10H 29/962; H10B 80/00; H10K 39/10; H10K 39/12; H10K 39/15; H10K 39/18; H10K 39/601; H10K 39/621; H10K 59/90; H10K 59/95; H10N 19/00; H10N 39/00; H10N 59/00; H10N 69/00; H10N 79/00; H10N 89/00
See application file for complete search history.

(56) References Cited

U.S. PATENT DOCUMENTS

| | | | |
|---|---|---|---|
| 10,340,419 B2 | 7/2019 | Kim et al. | |
| 10,483,339 B2 | 11/2019 | Moon et al. | |
| 11,092,863 B2 | 8/2021 | Chun et al. | |
| 11,296,267 B2 | 4/2022 | Jang et al. | |
| 2013/0307760 A1 | 11/2013 | Kim | |
| 2015/0009106 A1* | 1/2015 | Lee | G09G 3/3233 345/77 |
| 2018/0019377 A1* | 1/2018 | Kim | H10H 29/142 |

FOREIGN PATENT DOCUMENTS

| | | |
|---|---|---|
| KR | 10-2017-0070937 | 6/2017 |
| KR | 10-2018-0009014 | 1/2018 |
| KR | 10-2018-0011404 | 2/2018 |
| KR | 10-1987196 | 6/2019 |
| KR | 10-2019-0138179 | 12/2019 |
| KR | 10-2020-0065161 | 6/2020 |
| KR | 20200076191 A * | 6/2020 ......... H10K 59/1216 |

* cited by examiner

DISPLAY DEVICE

CROSS-REFERENCE TO RELATED APPLICATION(S)

This application claims priority to and the benefit of Korean Patent Application No. 10-2021-0088075 under 35 U.S.C. § 119, filed in the Korean Intellectual Property Office (KIPO) on Jul. 5, 2021, the entire contents of which are incorporated herein by reference.

BACKGROUND

1. Technical Field

The disclosure relates to a display device.

2. Description of Related Art

As interest in an information display is increasing, research and development for display devices are continuously conducted.

SUMMARY

The disclosure has been made in an effort to provide a display device having excellent or desirable image quality.

The objects of the disclosure are not limited to the object mentioned above, and other technical objects that are not mentioned may be clearly understood to a person of an ordinary skill in the art using the following description.

An embodiment provides a display device including pixels, each of the pixels including light emitting parts disposed in a first direction; pixel circuits including storage capacitors disposed in a second direction intersecting the first direction; a scan line extending in the first direction between the storage capacitors; a sub-scan line electrically connected to the scan line and extending in the second direction; and connection lines that electrically connect the light emitting parts and the pixel circuits and do not overlap the sub-scan line in a plan view. The pixel circuits may include a first pixel circuit including a first storage capacitor and at least one transistor electrically connected to the first storage capacitor; a second pixel circuit including a second storage capacitor and at least one transistor electrically connected to the second storage capacitor; and a third pixel circuit including a third storage capacitor and at least one transistor electrically connected to the third storage capacitor.

The first storage capacitor may be disposed between the second storage capacitor and the third storage capacitor.

The scan line may be disposed between the first storage capacitor and the third storage capacitor.

The first to third pixel circuits may share the sub-scan line.

The light emitting parts may include a first light emitting part electrically connected to the first pixel circuit; a second light emitting part electrically connected to the second pixel circuit; and a third light emitting part electrically connected to the third pixel circuit.

The second light emitting part may be disposed between the first light emitting part and the third light emitting part.

The connection lines may include a first connection line electrically connecting the second light emitting part and the second pixel circuit; and a second connection line electrically connecting the third light emitting part and the third pixel circuit.

The sub-scan line may be disposed between the first connection line and the second connection line.

The first connection line may bypass one end of the sub-scan line, and the second connection line may bypass another end of the sub-scan line.

The first to third storage capacitors may not overlap the first light emitting part or the third light emitting part in a plan view.

The connection lines and the scan line may be disposed on a same layer.

The scan line may be disposed on the sub-scan line.

The display device may further include a bank including opening areas overlapping the light emitting parts in a plan view.

Each of the light emitting parts may include a first electrode and a second electrode spaced apart from each other in the first direction in the opening area; light emitting elements disposed between the first electrode and the second electrode; a first connection electrode electrically connected to one end of the light emitting elements; and a second connection electrode electrically connected to another end of the light emitting elements.

The first connection electrode may be electrically connected to the connection lines through a first contact hole.

The first contact hole may not overlap the opening areas in a plan view.

The second connection electrode may be electrically connected to a power line receiving a driving power source through a second contact hole.

The second contact hole may not overlap the opening area in a plan view.

The power line may extend in the first direction between the pixel circuits.

Particularities of other embodiments are included in the detailed description and drawings.

According to the embodiment of the disclosure, connecting lines electrically connected to a light emitting part are disposed to bypass a sub-scan line to not overlap the sub-scan line, so that parasitic capacitance between the connecting lines and the sub-scan line may be reduced, thereby realizing excellent image quality.

Effects of embodiments of the disclosure are not limited by what is illustrated in the above, and more various effects are included in the present specification.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
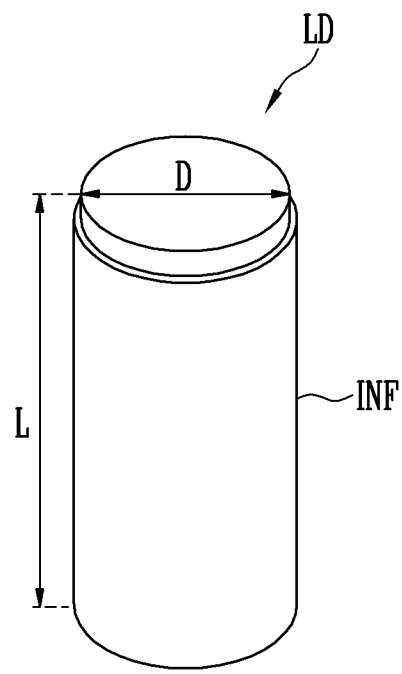
FIGS. 1 and 2 schematically illustrate a perspective view and a cross-sectional view of a light emitting element according to an embodiment, respectively.

Advantages and features of the disclosure and methods of accomplishing the same may be understood more readily by reference to the following detailed description of embodiments and the accompanying drawings. The disclosure may, however, be embodied in different forms and should not be construed as being limited to the embodiments set forth herein. The embodiments are provided so that this disclosure will be thorough and complete, and will convey the scope of the disclosure to those skilled in the art, and further, the disclosure is only defined by scopes of claims.

The terms used herein are for the purpose of describing particular embodiments only and is not intended to be limiting. As used herein, the singular forms "a", "an," and "the" are intended to include meanings of the plural forms as well, unless the context clearly indicates otherwise. It will be further understood that the terms "comprise" and/or "comprising", "include" or "including", and "have" or "having", when used in the disclosure, specify the presence of stated elements, steps, operations, and/or devices, but do not preclude the presence or addition of one or more other elements, steps, operations, and/or devices.

In addition, the term "connection" or "coupling" may comprehensively mean a physical and/or electrical connection or coupling. Further, this may comprehensively mean a direct or indirect connection or coupling, and an integrated or non-integrated connection or coupling.

It will be understood that when an element or a layer is referred to as being "on" another element or layer, it can be directly on another element or layer, or intervening element or layer may also be present. Throughout the specification, the same reference numerals denote the same constituent elements.

Although the terms "first", "second", and the like are used to describe various constituent elements, these constituent elements are not limited by these terms. These terms are used only to distinguish one constituent element from another constituent element. Therefore, the first constituent elements described below may be the second constituent elements within the technical spirit of the disclosure.

Hereinafter, embodiments of the disclosure will be described in detail with reference to the accompanying drawings.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 2:
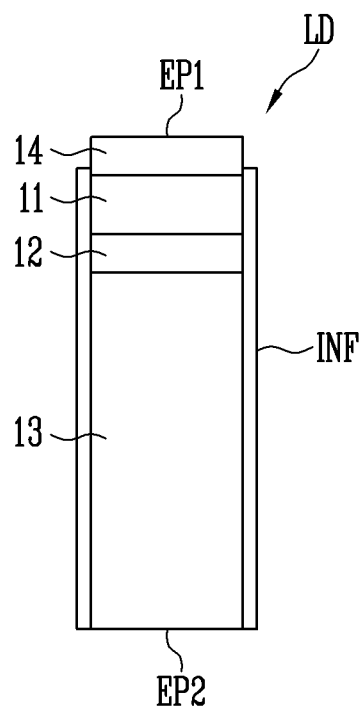

FIGS. 1 and 2 illustrate a schematic perspective view and a schematic cross-sectional view of a light emitting element according to an embodiment, respectively. FIGS. 1 and 2 illustrate a cylindrical light emitting element LD, but a type and/or shape of the light emitting element LD is not limited thereto.

Referring to FIGS. 1 and 2, a light emitting element LD may include a first semiconductor layer 11, an active layer 12, a second semiconductor layer 13, and/or an electrode layer 14.

The light emitting element LD may be formed to have a cylindrical shape extending in a direction. The light emitting element LD may have a first end portion EP1 and a second end portion EP2. One of the first and second semiconductor layers 11 and 13 may be disposed on the first end portion EP1 of the light emitting element LD. The remaining one of the first and second semiconductor layers 11 and 13 may be disposed on the second end portion EP2 of the light emitting element LD. For example, the first semiconductor layer 11 may be disposed on the first end portion EP1 of the light emitting element LD, and the second semiconductor layer 13 may be disposed on the second end EP2 of the light emitting element LD.

In some embodiments, the light emitting element LD may be a light emitting element manufactured in a cylindrical shape by an etching method or the like. In the specification, the "cylindrical shape" includes a rod-like shape or bar-like shape with an aspect ratio greater than 1, such as a circular cylinder or a polygonal cylinder, but a shape of a cross-section thereof is not limited thereto.

The light emitting element LD may have a size as small as a nanometer scale to a micrometer scale. For example, the light emitting element LD may each have a diameter D (or width) and/or a length L ranging from a nanometer scale to a micrometer scale. However, the size of the light emitting element LD is not limited thereto, and the size of the light emitting element LD may be variously changed according to design conditions of various devices using a light emitting device using the light emitting element LD as a light source, for example, a display device.

The first semiconductor layer 11 may be a first conductive semiconductor layer. For example, the first semiconductor layer 11 may include a p-type semiconductor layer. For example, the first semiconductor layer 11 may include at least one semiconductor material of InAlGaN, GaN, AlGaN, InGaN, and AlN, and may include a p-type semiconductor layer doped with a first conductive dopant such as Mg. However, the material included in the first semiconductor layer 11 is not limited thereto, and the first semiconductor layer 11 may be made of (or include) various materials.

The active layer 12 may be disposed between the first semiconductor layer 11 and the second semiconductor layer 13. The active layer 12 may include one of a single well structure, a multi-well structure, a single quantum well structure, a multi-quantum well (MQW) structure, a quantum dot structure, and a quantum line structure, but the disclosure is not limited thereto. The active layer 12 may include GaN, InGaN, InAlGaN, AlGaN, or AlN, and in addition, it may include various other materials.

In case that a voltage of a threshold voltage or more is applied to respective ends of the light emitting element LD, the light emitting element LD emits light while electron-hole pairs are combined in the active layer 12. By controlling the light emission of the light emitting element LD by using this principle, the light emitting element LD may be used as a light source for various light emitting devices in addition to pixels of a display device.

The second semiconductor layer 13 is disposed on the active layer 12 and may include a semiconductor layer of a type different from that of the first semiconductor layer 11. The second semiconductor layer 13 may include an n-type semiconductor layer. For example, the second semiconductor layer 13 may include a semiconductor material of one of InAlGaN, GaN, AlGaN, InGaN, and AlN, and may include an n-type semiconductor layer doped with a second conductive dopant such as Si, Ge, Sn, or the like. However, the material included in the second semiconductor layer 13 is not limited thereto, and the second semiconductor layer 13 may be made of various materials.

The electrode layer 14 may be disposed on the first end portion EP1 and/or the second end portion EP2 of the light emitting element LD. FIG. 2 illustrates that the electrode layer 14 is formed on the first semiconductor layer 11, but the disclosure is not limited thereto. For example, a separate electrode layer may be further disposed on the second semiconductor layer 13.

The electrode layer 14 may include a transparent metal or transparent metal oxide. As an example, the electrode layer 14 may include at least one of an indium tin oxide (ITO), an indium zinc oxide (IZO), and a zinc tin oxide (ZTO), but the disclosure is not limited thereto. Therefore, in case that the electrode layer 14 is made of a transparent metal or a transparent metal oxide, light generated from the active layer 12 of the light emitting element LD may transmit through the electrode layer 14 to be emitted to the outside of the light emitting element LD.

An insulation film INF may be provided on a surface of the light emitting element LD. The insulation film INF may be directly disposed on surfaces of the first semiconductor layer 11, the active layer 12, the second semiconductor layer 13, and/or the electrode layer 14. The insulation film INF may expose the first and second end portions EP1 and EP2 of the light emitting element LD having different polarities. In some embodiments, the insulation film INF may expose side portions of the electrode layer 14 and/or the second semiconductor layer 13 that are adjacent to the first and second end portions EP1 and EP2 of the light emitting element LD.

The insulation film INF may prevent an electrical short circuit that may occur in case that the active layer 12 contacts conductive materials other than the first and second semiconductor layers 11 and 13. The insulation film INF may minimize surface defects of the light emitting elements LD to improve the lifespan and luminous efficiency of the light emitting elements LD.

The insulation film INF may include at least one of a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), and a titanium oxide ($TiO_x$). For example, the insulation film INF may be configured as a double layer, and respective layers configuring the double layer may include different materials. For example, the insulation film INF may be formed as a double layer made of an aluminum oxide ($AlO_x$) and a silicon oxide ($SiO_x$), but the disclosure is not limited thereto. In some embodiments, the insulation film INF may be omitted.

A light emitting device including the light emitting element LD described above may be used in various types of devices including a display device that require a light source.

For example, the light emitting elements LD may be disposed in each pixel of a display panel, and the light emitting elements LD may be used as a light source of each pixel. However, an application field of the light emitting element LD is not limited to the above-described example. For example, the light emitting element LD may be used in other types of devices that require a light source, such as a lighting device.

Figure 3:
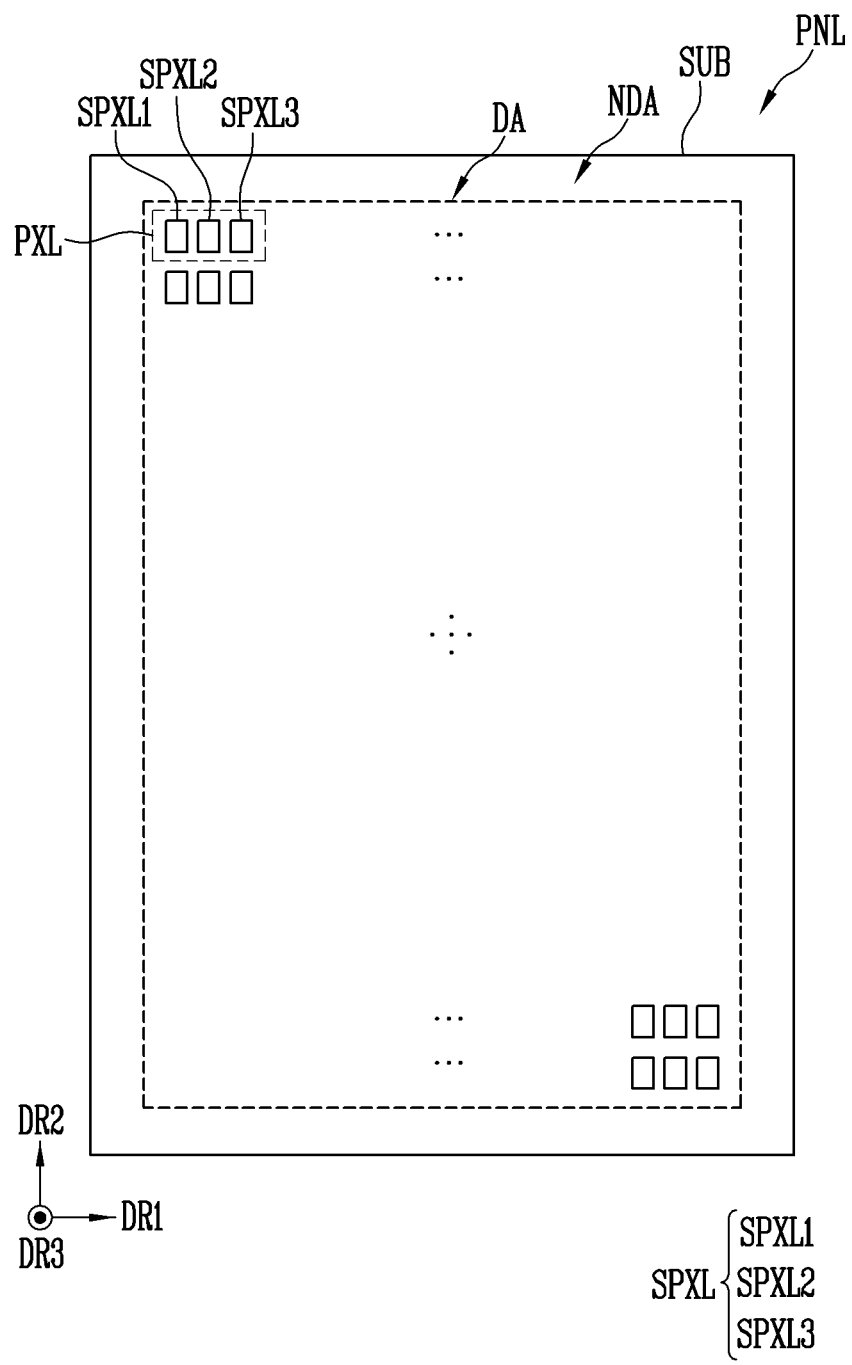
FIG. 3 schematically illustrates a plan view of a display device according to an embodiment.

FIG. 3 illustrates a schematic plan view of a display device according to an embodiment.

FIG. 3 illustrates a display device, in particular, a display panel PNL provided in the display device, as an example of an electronic device that may use the light emitting element LD described in the embodiments of FIGS. 1 and 2 as a light source.

Each pixel PXL of the display panel PNL and each sub-pixel SPXL configuring the same may include at least one light emitting element LD. For better understanding and ease of description, FIG. 3 briefly illustrates a structure of the display panel PNL, focusing on a display area DA. However, in some embodiments, at least one driving circuit portion (for example, at least one of a scan driver and a data driver), wires, and/or pads, which are not shown, may be further disposed in the display panel PNL.

Referring to FIG. 3, the display panel PNL may include a substrate SUB and the pixels PXL disposed on the substrate SUB. Each of the pixels PXL may include a first sub-pixel SPXL1, a second sub-pixel SPXL2, and/or a third sub-pixel SPXL3. Hereinafter, when arbitrarily referring to at least one of the first sub-pixel SPXL1, the second sub-pixel SPXL2, and the third sub-pixel SPXL3, or comprehensively referring to two or more thereof, they are referred to as a "sub-pixel SPXL" or "sub-pixels SPXL".

The substrate SUB configures a base member of the display panel PNL and may be a rigid or flexible substrate or film. For example, the substrate SUB may be formed as a rigid substrate made of glass or tempered glass and as a flexible substrate made of a plastic or metallic material (or a thin film), but the material and/or physical properties of the substrate SUB are not particularly limited.

The display panel PNL and the substrate SUB for forming the display panel PNL include a display area DA for displaying an image and a non-display area NDA excluding the display area DA. The pixels PXL may be disposed in the display area DA. In the non-display area NDA, various wires electrically connected to the pixels PXL of the display area DA, pads, and/or internal circuit parts may be disposed. The pixels PXL may be regularly arranged according to a stripe or PENTILE™ arrangement structure. However, the arrangement structure of the pixels PXL is not limited thereto, and the pixels PXL may be arranged in the display area DA in various structures and/or methods.

In some embodiments, each of the pixels PXL may include two or more types of sub-pixels SPXL emitting light of different colors. For example, in the display area DA, the first sub-pixels SPXL1 emitting light of a first color, the second sub-pixels SPXL2 emitting light of a second color, and the third sub-pixels SPXL3 emitting light of a third color may be arranged. At least one of the first to third sub-pixels SPXL1, SPXL2, and SPXL3 disposed to be adjacent to each other may form a pixel PXL that may emit light of various colors. For example, the first sub-pixel SPXL1 may be a red pixel that emits red light, the second sub-pixel SPXL2 may be a green pixel that emits green light, and the third sub-pixel SPXL3 may be a blue pixel that emits blue light, but the disclosure is not limited thereto.

In an embodiment, the first sub-pixel SPXL1, the second sub-pixel SPXL2, and the third sub-pixel SPXL3 are provided with light emitting elements LD of the same color and include color conversion layers and/or color filters of different colors disposed on respective light emitting elements LD, so that they may emit light of the first color, the second color, and the third color, respectively. In an embodiment, the first sub-pixel SPXL1, the second sub-pixel SPXL2, and the third sub-pixel SPXL3 are each provided with a first color light emitting element, a second color light emitting element, and a third color light emitting element as a light source, respectively, so that they respectively emit light of the first color, second color, and third color. However, the color, type, and/or number of the sub-pixels SPXL configuring each pixel PXL are not particularly limited.

The sub-pixel SPXL may include at least one light source driven by a control signal (for example, a scan signal and a data signal) and/or a power source (for example, a first driving power source and a second driving power source). In an embodiment, the light source may include at least one light emitting element LD according to one of the embodiments of FIGS. 1 and 2, for example, ultra-small cylindrical light emitting elements LD having a size as small as the nanometer scale to the micrometer scale. However, the disclosure is not limited thereto, and various types of light emitting elements LD may be used as a light source of the sub-pixel SPXL.

In an embodiment, each sub-pixel SPXL may be configured as an active pixel. However, the type, structure, and/or driving method of the sub-pixels SPXL that may be applied to the display device are not particularly limited. For example, each sub-pixel SPXL may be configured as a pixel of a passive or active light emitting display device having various structures and/or driving methods.

Figure 4:
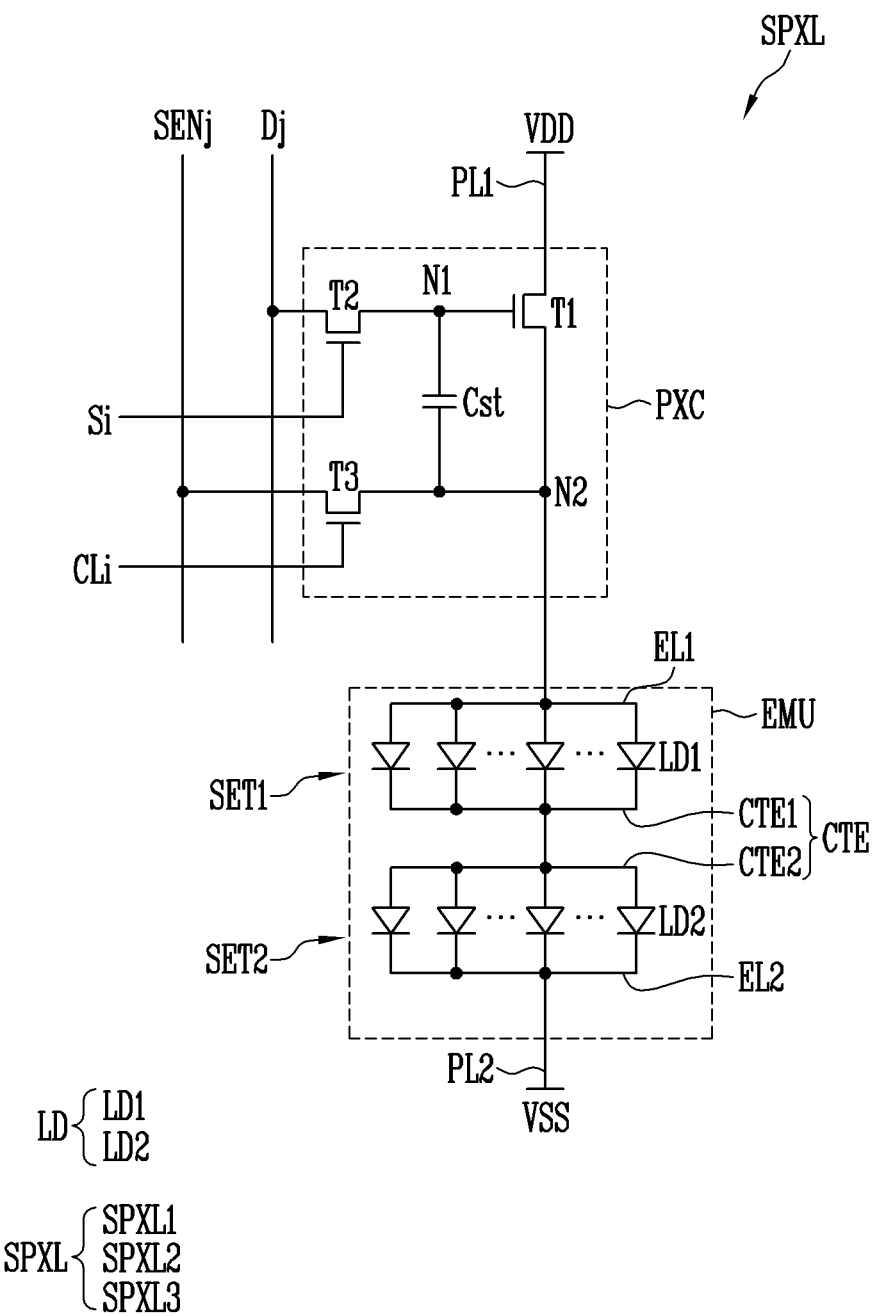
FIG. 4 schematically illustrates a diagram of equivalent circuit of a sub-pixel according to an embodiment.

FIG. 4 illustrates a schematic diagram of an equivalent circuit of a sub-pixel according to an embodiment.

FIG. 4 illustrates an electrical connection relationship of constituent elements included in each of the first to third sub-pixels SPXL1, SPXL2, and SPXL3 shown in FIG. 3, but the constituent elements included in each of the first to third sub-pixels SPXL1, SPXL2, and SPXL3 are not limited thereto. As illustrated in FIG. 4, not only the constituent elements included in each of the first to third sub-pixels SPXL1, SPXL2, and SPXL3, but also an area in which the constituent elements are provided are comprehensively referred to as a sub-pixel SPXL.

Referring to FIG. 4, each of the first to third sub-pixels SPXL1, SPXL2, and SPXL3 may include a light emitting part (or light emitting unit) EMU that generates light of luminance in response to a data signal. The sub-pixel SPXL may further include a pixel circuit PXC for driving the light emitting part EMU.

In some embodiments, the light emitting part EMU may include the light emitting elements LD electrically connected in parallel between a first power line PL1 to which a voltage of a first driving power source VDD is applied and a second power line PL2 to which a voltage of a second driving power source VSS is applied. For example, the light emitting part EMU may include a first electrode EL1 electrically connected to the first driving power source VDD via the pixel circuit PXC and the first power line PL1, a second electrode EL2 electrically connected to the second driving power source VSS through the second power line PL2, and the light emitting elements LD electrically connected in parallel between the first and second electrodes EL1 and EL2. The first electrode EL1 may be an anode, and the second electrode EL2 may be a cathode.

Each of the light emitting elements LD included in the light emitting part EMU may include one end portion (or first end portion) electrically connected to the first driving power source VDD through the first electrode EL1 and the other end portion (or second end portion) electrically connected to the second driving power source VSS through the second electrode EL2. The first driving power source VDD and the second driving power source VSS may have different potentials. For example, the first driving power source VDD may be set as a high-potential power source, and the second driving power source VSS may be set as a low-potential power source. In this case, a potential difference between the first and second driving power sources VDD and VSS may be set to be equal to or higher than a threshold voltage of the light emitting elements LD during a light emitting period of the sub-pixel SPXL.

Respective light emitting elements LD electrically connected in parallel in the same direction (for example, a forward direction) between the first electrode EL1 and the second electrode EL2 may form respective effective light sources. The effective light sources may collectively form the light emitting part EMU of the sub-pixel SPXL.

The light emitting elements LD of the light emitting part EMU may emit light with luminance corresponding to a driving current supplied through the corresponding pixel circuit PXC. For example, during each frame period, the pixel circuit PXC may supply a driving current corresponding to a grayscale value of corresponding frame data to the light emitting part EMU. The driving current supplied to the light emitting part EMU may be divided and flow in each of the light emitting elements LD. Therefore, while each light emitting element LD emits light with a luminance corresponding to the current flowing therein, the light emitting part EMU may emit light having a luminance corresponding to the driving current.

The pixel circuit PXC may be electrically connected to a scan line Si and a data line Dj of the corresponding sub-pixel SPXL, where i and j are natural numbers. For example, in case that the sub-pixel SPXL is disposed in an i-th row and a j-th column of the display area DA, the pixel circuit PXC of the sub-pixel SPXL may be electrically connected to an i-th scan line Si and a j-th data line Dj of the display area DA. The pixel circuit PXC may be electrically connected to an i-th control line CLi and a j-th sensing line SENj of the display area DA.

The pixel circuit PXC described above may include first to third transistors T1, T2, and T3 and a storage capacitor Cst.

The first transistor T1 is a driving transistor for controlling a driving current applied to the light emitting part EMU, and may be electrically connected between the first driving power source VDD and the light emitting part EMU. A first terminal of the first transistor T1 may be electrically connected to the first driving power source VDD through the first power line PL1, a second terminal of the first transistor T1 may be electrically connected to a second node N2, and a gate electrode of the first transistor T1 may be electrically connected to a first node N1. The first transistor T1 may control an amount of the driving current applied to the light emitting part EMU from the first driving power source VDD through the second node N2 according to a voltage applied to the first node N1. In an embodiment, the first terminal of the first transistor T1 may be a drain electrode, and the second terminal of the first transistor T1 may be a source electrode, but the disclosure is not limited thereto. In some embodiments, the first terminal thereof may be a source electrode, and the second terminal thereof may be a drain electrode.

The second transistor T2 is a switching transistor that selects the sub-pixel SPXL in response to a scan signal and activates the sub-pixel SPXL, and may be electrically connected between the data line Dj and the first node N1. A first terminal of the second transistor T2 is electrically connected to the data line Dj, a second terminal of the second transistor T2 is electrically connected to the first node N1, and a gate electrode of the second transistor T2 is electrically connected to the scan line Si. The first terminal and the second terminal of the second transistor T2 are different terminals, and for example, in case that the first terminal is a drain electrode, the second terminal may be a source electrode.

In case that a scan signal having a gate-on voltage (for example, a high-level voltage) is supplied from the scan line Si, the second transistor T2 may be turned on to electrically connect the data line Dj and the first node N1. The first node N1 is a point at which the second terminal of the second transistor T2 is electrically connected to the gate electrode of the first transistor T1, and the second transistor T2 may transmit a data voltage to the gate electrode of the first transistor T1.

The third transistor T3 electrically connects the first transistor T1 to the sensing line SENj, so that it may obtain a sensing signal through the sensing line SENj, and may detect a characteristic of each sub-pixel SPXL in addition to a threshold voltage of the first transistor T1 by using the sensing signal. Information on the characteristic of each sub-pixel SPXL may be used to convert image data so that a characteristic deviation between the sub-pixels SPXL may be compensated. A second terminal of the third transistor T3 may be electrically connected to the second terminal of the first transistor T1, a first terminal of the third transistor T3 may be electrically connected to the sensing line SENj, and a gate electrode of the third transistor T3 may be electrically connected to the control line CLi. The first terminal of the third transistor T3 may be electrically connected to an initialization power source. The third transistor T3 is an initialization transistor capable of initializing the second node N2, and in case that a sensing control signal is supplied from the control line CLi, the third transistor T3 may be turned on to transmit a voltage of the initialization power source to the second node N2. Accordingly, a second storage electrode (or upper electrode) of the storage capacitor Cst electrically connected to the second node N2 may be initialized.

A first storage electrode of the storage capacitor Cst may be electrically connected to the first node N1, and the second storage electrode of the storage capacitor Cst may be electrically connected to the second node N2. The storage capacitor Cst is charged with a voltage corresponding to the data signal supplied to the first node N1 during a frame period. Accordingly, the storage capacitor Cst may store a voltage corresponding to a difference between a voltage of the gate electrode of the first transistor T1 and a voltage of the second node N2.

Each light emitting part EMU may be configured to include at least one serial stage (or stage) including light emitting elements LD electrically connected in parallel with each other. For example, the light emitting part EMU may be configured in a series-parallel mixed structure as shown in FIG. 4.

The light emitting part EMU may include first and second serial stages SET1 and SET2 sequentially electrically connected to between the first and second driving power sources VDD and VSS. Each of the first and second serial stages SET1 and SET2 may include two electrodes EL1 and CTE1, CTE2 and EL2 configuring an electrode pair of the corresponding serial stage, and the light emitting elements LD electrically connected in parallel in the same direction between the two electrodes EL1 and CTE1, CTE2 and EL2.

The first serial stage SET1 includes the first electrode EL1 and a first middle electrode CTE1, and it may include at least one first light emitting element LD1 electrically connected between the first electrode EL1 and the first middle electrode CTE1.

The second serial stage SET2 includes a second middle electrode CTE2 and the second electrode EL2, and it may include at least one second light emitting element LD2 electrically connected between the second middle electrode CTE2 and the second electrode EL2.

The first middle electrode CTE1 of the first serial stage SET1 and the second middle electrode CTE2 of the second serial stage SET2 are integrally provided (or integral with each other) to be electrically connected to each other. For example, the first middle electrode CTE1 and the second middle electrode CTE2 may be a middle electrode CTE that integrally and electrically connects the first serial stage SET1 and the second serial stage SET2. In case that the first middle electrode CTE1 and the second middle electrode CTE2 are integrally provided, the first middle electrode CTE1 and the second middle electrode CTE2 may be different areas of the middle electrode CTE.

As described above, the light emitting part EMU of the sub-pixel SPXL including the first and second serial stages SET1 and SET2 (or light emitting elements LD) electrically connected to each other in a series-parallel mixed structure may readily adjust a driving current/voltage condition according to an applied product specification.

The light emitting part EMU of the sub-pixel SPXL including the first and second serial stages SET1 and SET2 (or light emitting elements LD) electrically connected in a series-parallel mixed structure may reduce a driving current compared with a light emitting part EMU having a structure in which the light emitting elements LD are electrically connected only in parallel. The light emitting part EMU of the sub-pixel SPXL including the first and second serial stages SET1 and SET2 electrically connected to each other in a series-parallel mixed structure may reduce a driving voltage applied to both ends of the light emitting part EMU compared with a light emitting part EMU having a structure in which the same numbers of light emitting elements LD are electrically connected in series. Further, the light emitting part EMU of the sub-pixel SPXL including the first and second serial stages SET1 and SET2 (or light emitting elements LD) electrically connected to each other in a series-parallel mixed structure may include a larger number of light emitting elements LD between same number of electrodes EL1, CTE1, CTE2, and EL2 than a light emitting part EMU having a structure in which all of the serial stages are electrically connected in series. In this case, the light emitting efficiency of the light emitting elements LD may be improved, and even if a defect occurs in a specific serial stage, a ratio of the light emitting elements LD that do not emit light because of the defect is relatively reduced, and thus deterioration of the light emitting efficiency of the light emitting elements LD may be alleviated.

FIG. 4 illustrates an embodiment in which the first to third transistors T1, T2, and T3 are n-type transistors, but the disclosure is not limited thereto. For example, at least one of the first to third transistors T1, T2, and T3 may be changed to a p-type transistor. Although FIG. 4 illustrates the embodiment in which the light emitting part EMU is electrically connected between the pixel circuit PXC and the second driving power source VSS, the light emitting part EMU may also be electrically connected between the first driving power source VDD and the pixel circuit PXC.

The structure of the pixel circuit PXC may be variously changed. For example, the pixel circuit PXC may additionally include other circuit elements such as at least one transistor element such as a transistor element for initializing the first node N1 and/or a transistor element for controlling a light emission time of the light emitting elements LD, or a boosting capacitor for boosting the voltage of the first node N1.

Figure 5:
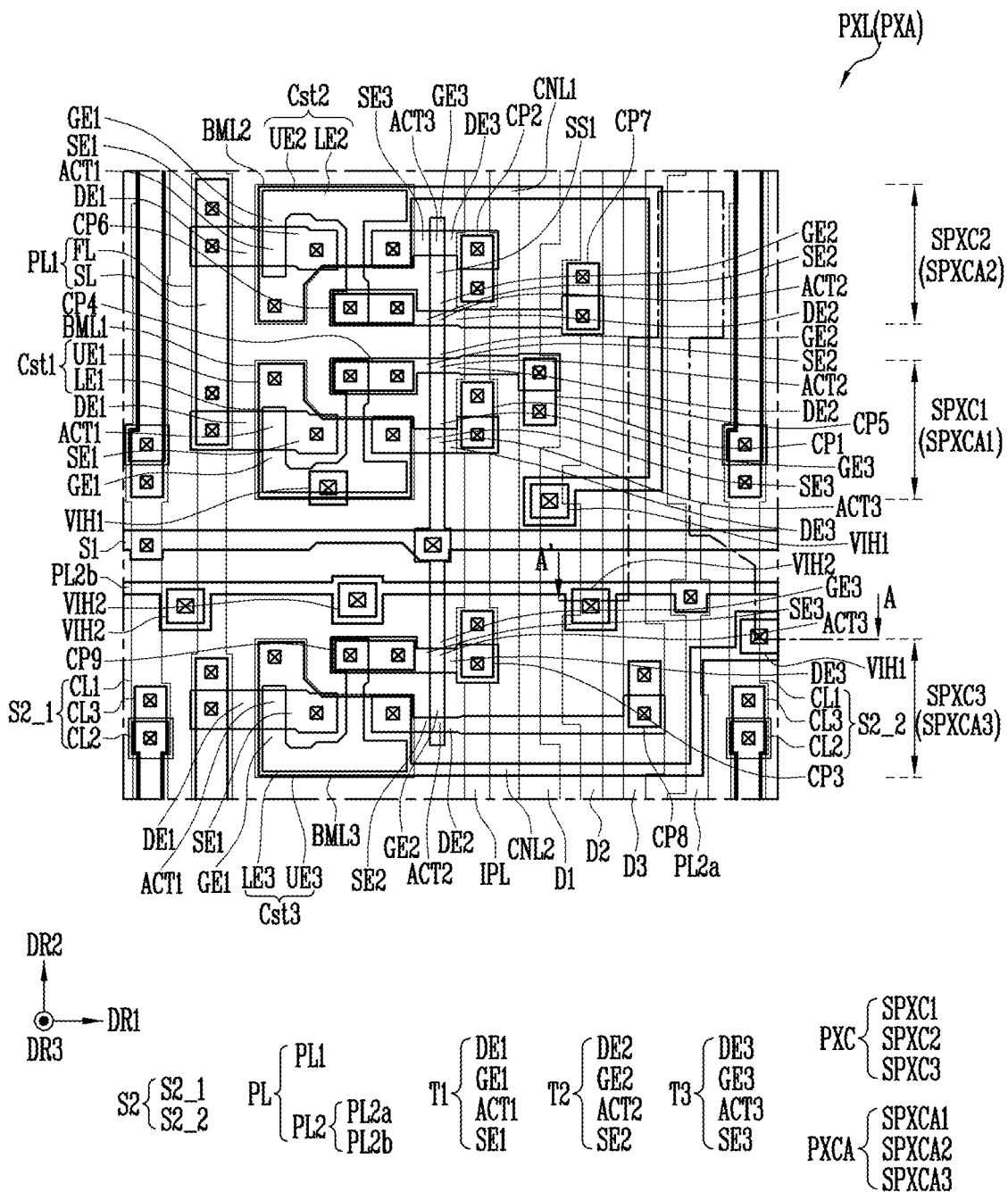
FIGS. 5 and 6 schematically illustrate plan views of a pixel circuit area according to an embodiment.
Figure 6:
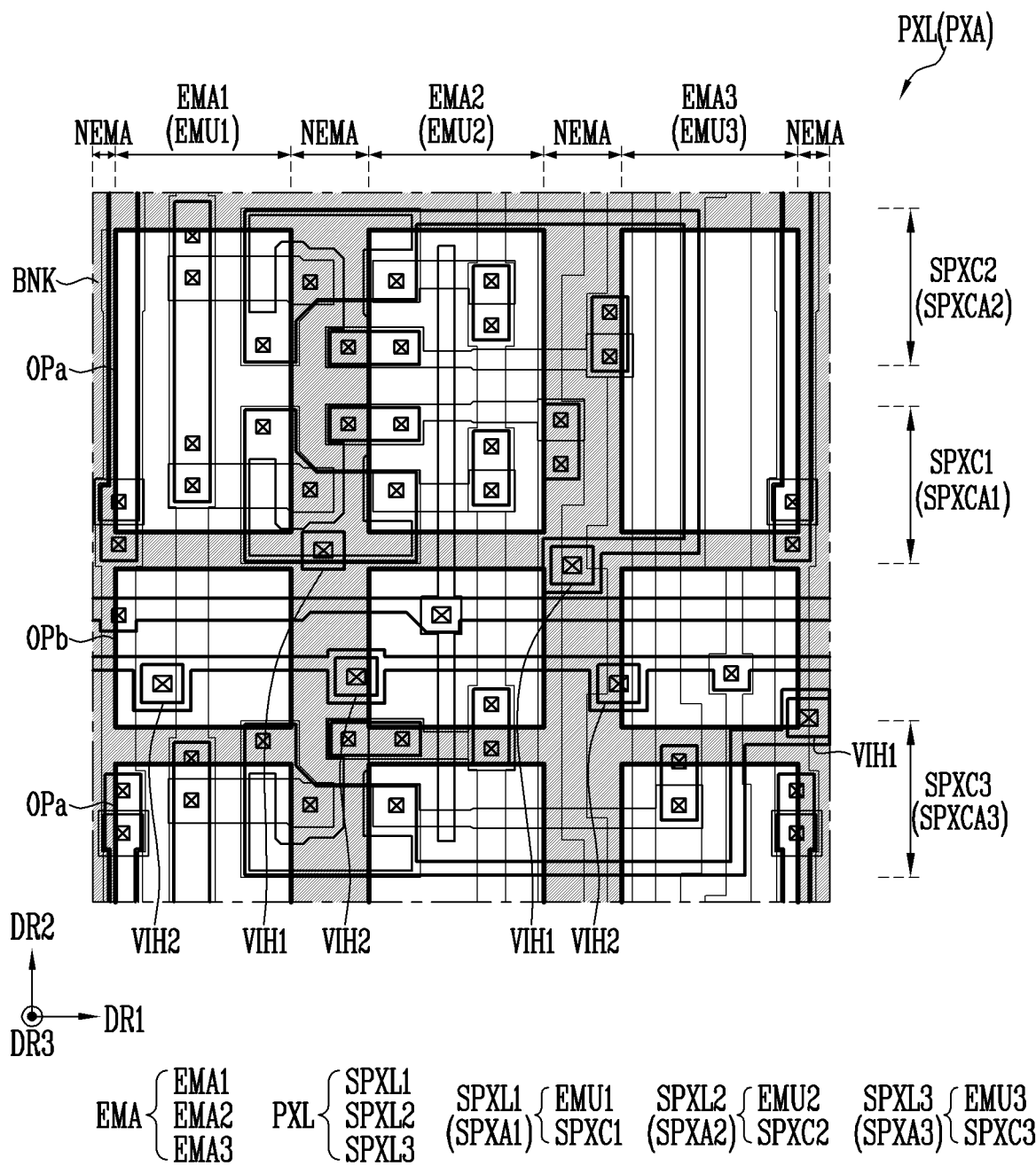
Figure 7:
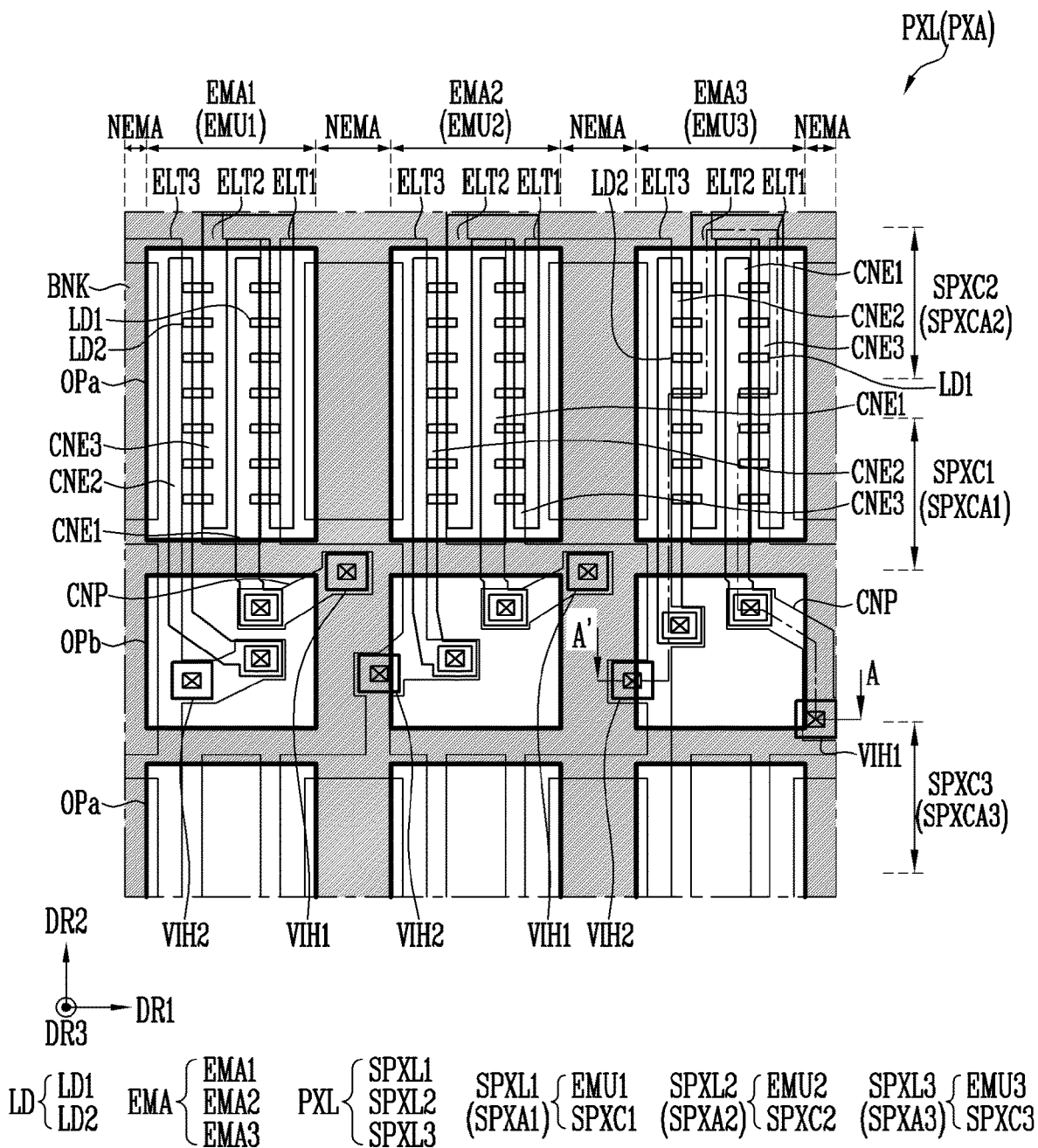
FIG. 7 schematically illustrates a plan view of a light emitting area according to an embodiment.
Figure 8:
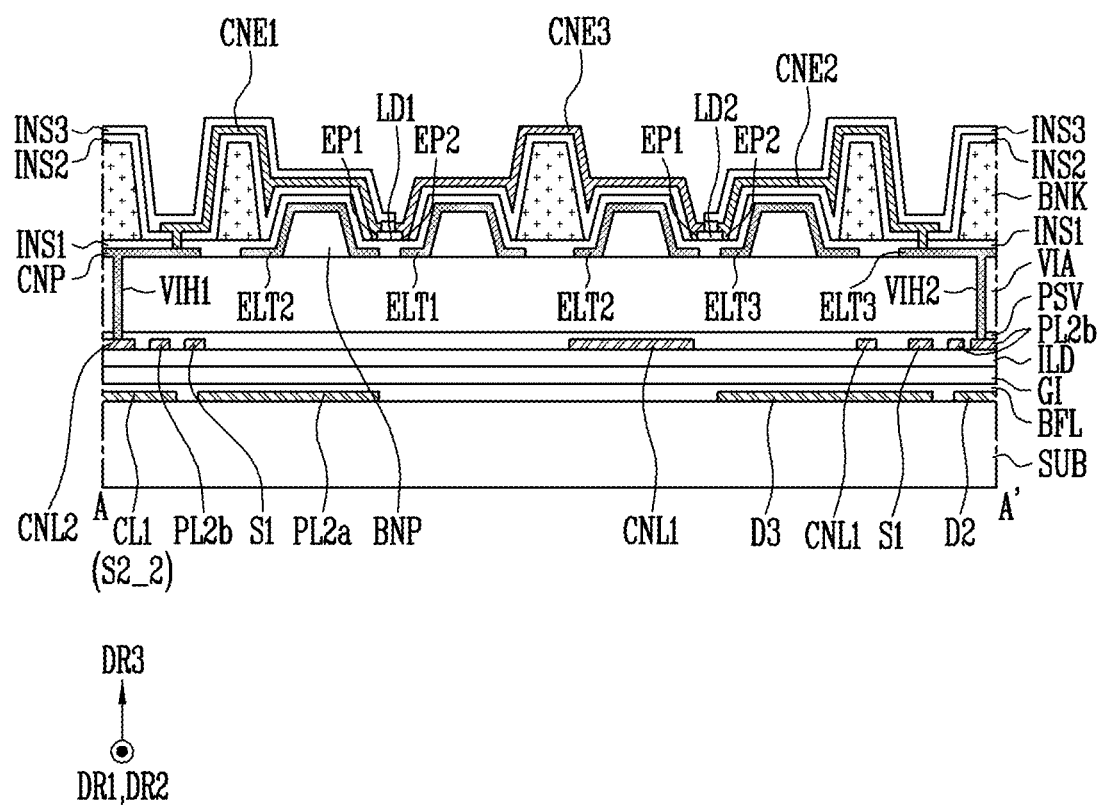
FIG. 8 schematically illustrates a cross-sectional view taken along line A-A' of FIG. 7.

FIGS. 5 and 6 illustrate schematic plan views of a pixel circuit area according to an embodiment. FIG. 6 further includes a bank BNK compared to the embodiment of FIG. 5. FIG. 7 illustrates a schematic plan view of a light emitting area according to an embodiment. FIG. 8 illustrates a schematic cross-sectional view taken along line A-A' of FIGS. 5 and 7.

Referring to FIGS. 5 to 8, the pixel PXL may include a first sub-pixel SPXL1, a second sub-pixel SPXL2, and a third sub-pixel SPXL3.

The first sub-pixel SPXL1 may include a first pixel circuit SPXC1 and a first light emitting part EMU1, the second sub-pixel SPXL2 may include a second pixel circuit SPXC2 and a second light emitting part EMU2, and the third sub-pixel SPXL3 may include a third pixel circuit SPXC3 and a third light emitting part EMU3.

The first pixel circuit SPXC1, the second pixel circuit SPXC2, and the third pixel circuit SPXC3 may configure the pixel circuit PXC of the pixel PXL. The first light emitting part EMU1, the second light emitting part EMU2, and the third light emitting part EMU3 may configure the light emitting part EMU (see FIG. 4) of the pixel PXL.

An area of a pixel area PXA of the pixel PXL in which the first sub-pixel SPXL1 is provided may be a first sub-pixel area SPXA1, an area of a pixel area PXA in which the second sub-pixel SPXL2 is provided may be a second sub-pixel area SPXA2, and an area of a pixel area PXA in which the third sub-pixel SPXL3 is provided may be a third sub-pixel area SPXA3.

The pixel area PXA may include a first pixel circuit area SPXCA1, a second pixel circuit area SPXCA2, and a third pixel circuit area SPXCA3. For example, the pixel area PXA may be partitioned in an order of the third pixel circuit area SPXCA3, the first pixel circuit area SPXCA1, and the second pixel circuit area SPXCA2 in a second direction DR2. For example, a first direction DR1 may mean an X-axis direction, the second direction DR2 may mean a Y-axis direction, and a third direction DR3 may mean a Z-axis direction.

The first pixel circuit area SPXCA1 may be an area in which the first pixel circuit SPXC1 is provided, the second pixel circuit area SPXCA2 may be an area in which the second pixel circuit SPXC2 is provided, and the third pixel circuit area SPXCA3 may be an area in which the third pixel circuit SPXC3 is provided. For example, the third pixel circuit SPXC3, the first pixel circuit SPXC1, and the second pixel circuit SPXC2 may be sequentially disposed in the second direction DR2.

The pixel area PXA may include a first light emitting area EMA1, a second light emitting area EMA2, and a third light emitting area EMA3. For example, the pixel area PXA may include the first light emitting area EMA1, the second light emitting area EMA2, and the third light emitting area EMA3 partitioned in the first direction DR1.

The first light emitting area EMA1 may be an area in which light is emitted from the light emitting elements LD driven by the first pixel circuit SPXC1. The light emitting elements LD may be a component of the first light emitting part EMU1. In an embodiment, the first light emitting area EMA1 may be a light emitting area of the first sub-pixel SPXL1.

The second light emitting area EMA2 may be an area in which light is emitted from the light emitting elements LD driven by the second pixel circuit SPXC2. The light emitting elements LD may be a component of the second light emitting part EMU2. In an embodiment, the second light emitting area EMA2 may be a light emitting area of the second sub-pixel SPXL2.

The third light emitting area EMA3 may be an area in which light is emitted from the light emitting elements LD driven by the third pixel circuit SPXC3. The light emitting elements LD may be a component of the third light emitting part EMU3. In an embodiment, the third light emitting area EMA3 may be a light emitting area of the third sub-pixel SPXL3.

The first light emitting area EMA1, the second light emitting area EMA2, and the third light emitting area EMA3 described above may form a light emitting area EMA of the pixel PXL.

The pixel area PXA may include a non-light emitting area NEMA adjacent to the first light emitting area EMA1 (or surrounding a periphery of the first light emitting area EMA1), a non-light emitting area NEMA adjacent to the second light emitting area EMA2 (or surrounding a periphery of the second light emitting area EMA2), and a non-light emitting area NEMA adjacent to the third light emitting area EMA3 (or surrounding a periphery of the third light emitting area EMA3).

Insulation layers and conductive layers may be disposed on the substrate SUB of the pixel PXL or the pixel area PXA. The insulation layers may include, for example, a buffer layer BFL, a gate insulation layer GI, an interlayer insulation layer ILD, a passivation layer PSV, a via layer VIA, first to third insulation layers INS1, INS2, and INS3 sequentially provided on the substrate SUB. The conductive layers may be provided and/or formed between the insulation layers described above. The conductive layers may include, for example, a first conductive layer provided on the substrate SUB, a second conductive layer provided on the gate insulation layer GI, a third conductive layer provided on the interlayer insulation layer ILD, a fourth conductive layer provided on the via layer VIA, a fifth conductive layer provided on the second insulation layer INS2, and a sixth conductive layer provided on the third insulation layer INS3. However, the insulation layers and the conductive layers provided on the substrate SUB are not limited to the above-described embodiment, and in some embodiments, other insulation layers and other conductive layers other than the insulation layers and the conductive layers may be provided on the substrate SUB.

Signal lines electrically connected to the pixel PXL may be disposed on the substrate SUB. The signal lines may transmit a signal (e.g., a predetermined voltage) to the pixel PXL. For example, the signal lines may include a first scan line S1, a second scan line S2, data lines D1, D2, and D3, a power line PL, and an initialization power line IPL.

A scan signal and a control signal may be selectively applied to the first scan line S1. The first scan line S1 may extend in the first direction DR1. The first scan line S1 may extend in the first direction DR1 between the first to third pixel circuits SPXC1, SPXC2, and SPXC3. The first scan line S1 may extend in the first direction DR1 between the first pixel circuit SPXC1 and the third pixel circuit SPXC3. For example, the first scan line S1 may extend in the first direction DR1 between a first storage capacitor Cst1 and a third storage capacitor Cst3 to be described below, but the disclosure is not limited thereto.

The first scan line S1 may be a third conductive layer provided on the interlayer insulation layer ILD. The third conductive layer may be formed as a single layer or multi-layer made of at least one of molybdenum (Mo), copper (Cu), aluminum (Al), chromium (Cr), gold (Au), titanium (Ti), nickel (Ni), neodymium (Nd), and an indium tin oxide (ITO), or an alloy thereof.

The first scan line S1 may be disposed on a sub-scan line SS1 to be electrically connected to the sub-scan line SS1 through a contact hole. For example, the first scan line S1 may be electrically and/or physically connected to the sub-scan line SS1 through a contact hole penetrating the interlayer insulation layer ILD.

The sub-scan line SS1 may extend in the second direction DR2. The sub-scan line SS1 may be a second conductive layer provided and/or formed on the gate insulation layer GI. The second conductive layer and the third conductive layer described above may include the same material, or the second conductive layer may include one or more of the materials exemplified as the material of the third conductive layer.

In an embodiment, the sub-scan line SS1 may be provided integrally with a second gate electrode GE2 of the second transistor T2 of each of the first to third pixel circuits SPXC1, SPXC2, and SPXC3. For example, a portion of the sub-scan line SS1 may be the second gate electrode GE2 of the second transistor T2 of each of the first to third pixel circuits SPXC1, SPXC2, and SPXC3. Accordingly, the sub-scan line SS1 may be electrically connected to the second gate electrode GE2 of the second transistor T2 of each of the first to third pixel circuits SPXC1, SPXC2, and SPXC3.

The sub-scan line SS1 may be provided integrally with a third gate electrode GE3 of the third transistor T3 of each of the first to third pixel circuits SPXC1, SPXC2, and SPXC3. For example, another portion of the sub-scan line SS1 may be the third gate electrode GE3 of the third transistor T3 of each of the first to third pixel circuits SPXC1, SPXC2, and SPXC3. Accordingly, the sub-scan line SS1 may be electrically connected to the third gate electrode GE3 of the third transistor T3 of each of the first to third pixel circuits SPXC1, SPXC2, and SPXC3.

As described above, as the sub-scan line SS1 is electrically connected to the first scan line S1 through the contact hole, the first scan line S1 may be electrically connected to some components of each of the first to third pixel circuits SPXC1, SPXC2, and SPXC3, for example, the second and third transistors T2 and T3, through the sub-scan line SS1. In this case, the first scan line S1 may supply a scan signal to the second transistor T2 of each of the first to third pixel circuits SPXC1, SPXC2, and SPXC3 during a driving period of the light emitting elements LD, and may supply a control signal to the third transistor T3 of each of the first to third pixel circuits SPXC1, SPXC2, and SPXC3 during a sensing period.

The sub-scan line SS1 may be a common component commonly provided in first to third pixel circuits SPXC1, SPXC2, and SPXC3. For example, the first to third pixel circuits SPXC1, SPXC2, and SPXC3 may share a sub-scan line SS1.

The data lines D1, D2, and D3 may extend in the second direction DR2 and may include a first data line D1, a second data line D2, and a third data line D3 spaced apart from each other in the first direction DR1. A data signal may be applied to each of the first to third data lines D1, D2, and D3.

The first data line D1 may be electrically connected to the second transistor T2 of the first pixel circuit SPXC1, the second data line D2 may be electrically connected to the second transistor T2 of the second pixel circuit SPXC2, and the third data line D3 may be electrically connected to the second transistor T2 of the third pixel circuit SPXC3. The first to third data lines D1, D2, and D3 may be a first conductive layer provided on the substrate SUB. The first conductive layer and the third conductive layer described above may include the same material, or the first conductive layer may include one or more of the materials exemplified as the material of the third conductive layer.

The power line PL may include the first power line PL1 and the second power line PL2.

A voltage of the first driving power source VDD (see FIG. 4) may be applied to the first power line PL1. The first power line PL1 may extend in the second direction DR2. In an embodiment, the first power line PL1 may include a first layer FL and a second layer SL. The first layer FL may be a first conductive layer provided and/or formed on the substrate SUB. The second layer SL may be a third conductive layer provided and/or formed on the interlayer insulation layer ILD. The first layer FL and the first to third data lines D1, D2, and D3 may be provided on the same layer, and the second layer SL and the first scan line S1 may be provided on the same layer. The second layer SL may be electrically connected to the first layer FL through at least one contact hole. For example, the second layer SL may be electrically and/or physically connected to the first layer FL through at least one contact hole sequentially penetrating the buffer layer BFL, the gate insulation layer GI, and the interlayer insulation layer ILD. The first power line PL1 is implemented as a double layer structure including the first layer FL and the second layer SL to be able to reduce wire resistance to reduce signal distortion. However, the disclosure is not limited thereto, and the first power line PL1 may be implemented as a single layer structure or a multi-layer structure of three or more layers.

A voltage of the second driving power source VSS (see FIG. 4) may be applied to the second power line PL2. The second power line PL2 may include a 2a-th power line PL2a and a 2b-th power line PL2b.

The 2a-th power line PL2a may extend in the second direction DR2. The 2a-th power line PL2a may be implemented as a single layer structure. The 2a-th power line PL2a may be a first conductive layer provided and/or formed on the substrate SUB. The 2a-th power line PL2a, and the first to third data lines D1, D2, and D3 and the first layer FL of the first power line PL1 may be provided on the same layer. The 2a-th power line PL2a may be disposed to be spaced apart from the first to third data lines D1, D2, and D3 and the first power line PL1 in a plan view.

In the above-described embodiment, the embodiment in which the 2a-th power line PL2a is implemented as a single layer structure has been described, but the disclosure is not limited thereto. In some embodiments, the 2a-th power line PL2a may be implemented as a double layer structure similar to the first power line PL1. The 2a-th power line PL2a may be implemented as a multi-layer structure of three or more layers.

The 2b-th power line PL2b may extend in the first direction DR1. The 2b-th power line PL2b may extend in the first direction DR1 among the first to third pixel circuits SPXC1, SPXC2, and SPXC3. The 2b-th power line PL2b may extend in the first direction DR1 between the first pixel circuit SPXC1 and the third pixel circuit SPXC3. For example, the 2b-th power line PL2b may extend in the first direction DR1 between the first storage capacitor Cst1 and the third storage capacitor Cst3 to be described below, but the disclosure is not limited thereto. The 2b-th power line PL2b may be spaced apart from the first scan line S1 in a plan view. However, the position of the 2b-th power line PL2b is not limited thereto, and the position of the 2b-th power line PL2b may be variously changed as long as it does not overlap a first opening area OPa of the bank BNK, which will be described below, can be changed.

The 2b-th power line PL2b may be implemented as a single layer structure. The 2b-th power line PL2b may be a third conductive layer provided and/or formed on the interlayer insulation layer ILD. The 2b-th power line PL2b and the first scan line S1 and the second layer SL of the first power line PL1 may be provided on the same layer.

The 2a-th power line PL2a and the 2b-th power line PL2b may be electrically connected through a contact hole. As an example, the 2b-th power line PL2b may be electrically and/or physically connected to the 2a-th power line PL2a through a contact hole sequentially penetrating the buffer layer BFL, the gate insulation layer GI, and the interlayer insulation layer ILD. The second power line PL2 including the 2a-th power line PL2a and the 2b-th power line PL2b that are electrically connected to each other may have a mesh structure.

The second scan line S2 may extend in the second direction DR2 intersecting the first direction DR1 which is an extension direction of the first scan line S1. In the pixel PXL, the second scan line S2 may intersect the first scan line S1 to at least partially overlap the first scan line S1. The second scan line S2 may be a signal line that selectively receives a scan signal and a control signal. For example, the second scan line S2 may be supplied with a scan signal during a driving period of the light emitting elements LD, and may be supplied with a control signal during a predetermined sensing period.

In an embodiment, the second scan line S2 may include a (2-1)-th scan line S2_1 and a (2-2)-th scan line S2_2. Each of the (2-1)-th scan line S2_1 and the (2-2)-th scan line S2_2 may extend in the second direction DR2.

Each of the (2-1)-th scan line S2_1 and the (2-2)-th scan line S2_2 may be implemented as a triple layer structure including a first conductive line CL1, a second conductive line CL2, and a third conductive line CL3. The first conductive line CL1 may be a first conductive layer provided and/or formed on the substrate SUB, the second conductive line CL2 may be a second conductive layer provided and/or formed on the gate insulation layer GI, and the third conductive line CL3 may be a third conductive layer provided and/or formed on the interlayer insulation layer ILD.

The first conductive line CL1 and the first to third data lines D1, D2, and D3, the first layer FL of the first power line PL1, and the 2a-th power line PL2a may be provided on the same layer. The second conductive line CL2 and the sub-scan line SS1 may be provided on the same layer. The third conductive line CL3 and the first scan line S1 and the second layer SL of the first power line PL1 may be provided on the same layer. The third conductive line CL3 may be electrically connected to the first conductive line CL1 and/or the second conductive line CL2 through a contact hole. As an example, the third conductive line CL3 may be electrically and/or physically connected to the first conductive line CL1 through a contact hole sequentially penetrating the buffer layer BFL, the gate insulation layer GI, and the interlayer insulation layer ILD. The third conductive line CL3 may be electrically connected to the second conductive line CL2 through a contact hole penetrating the interlayer insulation layer ILD. Accordingly, the first conductive line CL1 and the second conductive line CL2 may be electrically connected to each other through the third conductive line CL3.

In an embodiment, the third conductive line CL3 may be provided and/or formed on the second conductive line CL2 with the interlayer insulation layer ILD therebetween, and the second conductive line CL2 may be provided and/or formed on the first conductive line CL1 with the gate insulation layer GI and the buffer layer BFL therebetween. The first conductive line CL1, the second conductive line CL2, and the third conductive line CL3 may overlap each other in a plan view and a cross-sectional view.

In the embodiment described above, it has been described that the (2-1)-th scan line S2_1 and the (2-2)-th scan line S2_2 are implemented as a triple layer structure including the first conductive line CL1, the second conductive line CL2, and the third conductive line CL3, but the disclosure is not limited thereto. In some embodiments, the (2-1)-th scan line S2_1 and the (2-2)-th scan line S2_2 may be implemented as a single layer structure, a double layer structure, or a multi-layer structure of three or more layers.

In some embodiments, the first conductive line CL1 of each of the (2-1)-th and (2-2)-th scan lines S2_1 and S2_2 may be commonly provided in some of the pixels PXL disposed in the same pixel column as the pixel PXL in the second direction DR2. For example, the first conductive line CL1 of each of the (2-1)-th and (2-2)-th scan lines S2_1 and S2_2 of the pixel PXL may be commonly provided in the pixels PXL disposed in the same pixel column in the second direction DR2. For example, the pixels PXL disposed in the same pixel column in the second direction DR2 may share the first conductive line CL1 of each of the (2-1)-th and (2-2)-th scan lines S2_1 and S2_2.

At least one of the (2-1)-th scan line S2_1 and the (2-2)-th scan line S2_2 may be electrically connected to the first scan line S1 through a contact hole. For example, the (2-1)-th scan line S2_1 may be electrically connected to the first scan line S1 through a contact hole sequentially passing through at least one insulation layer, for example, the buffer layer BFL, the gate insulation layer GI, and the interlayer insulation layer ILD. Accordingly, the first scan line S1 may selectively receive a scan signal and a control signal from the (2-1)-th scan line S2_1. For example, the second scan line S2 may be used as a signal line that may be electrically connected to the first scan line S1 to transmit a scan signal and a control signal together with the first scan line S1 to some components of each of the first to third pixel circuits SPXC1, SPXC2, and SPXC3, for example, the second and third transistors T2 and T3.

The initialization power line IPL may extend in the second direction DR2. The initialization power line IPL may be disposed between the first power line PL1 and the first data line D1. The initialization power line IPL may be the j-th sensing line SENj described with reference to FIG. 4. A voltage of the initialization power source may be applied to the initialization power line IPL. In an embodiment, the initialization power line IPL may be a first conductive layer provided and/or formed on the substrate SUB. The initialization power line IPL and the first to third data lines D1, D2, and D3, the first layer FL of the first power line PL1, the 2a-th power lines PL2a, and the first conductive line CL1 of each of the (2-1)-th and (2-2)-th scan lines S2_1 and S2_2 may be provided and/or formed on the same layer.

The initialization power line IPL may be electrically connected to the third transistor T3 of the first pixel circuit SPXC1 through a first conductive pattern CP1, may be electrically connected to the third transistor T3 of the second pixel circuit SPXC2 through a second conductive pattern CP2, and may be electrically connected to the third transistor T3 of the third pixel circuit SPXC3 through a third conductive pattern CP3.

The first conductive pattern CP1 may be a third conductive layer provided and/or formed on the interlayer insulation layer ILD. The first conductive pattern CP1 and the first scan line S1 may be provided and/or formed on the same layer.

One end (or first end) of the first conductive pattern CP1 may be electrically connected to the initialization power line IPL through a contact hole. As an example, one end of the first conductive pattern CP1 may be electrically and/or physically connected to the initialization power line IPL through a contact hole sequentially penetrating the buffer layer BFL, the gate insulation layer GI, and the interlayer insulation layer ILD.

The other end (or second end) of the first conductive pattern CP1 may be connected to the third transistor T3 of the first pixel circuit SPXC1 through another contact hole. For example, the other end of the first conductive pattern CP1 may be electrically connected to a third drain area DE3 of the third transistor T3 of the first pixel circuit SPXC1 through a contact hole sequentially penetrating the gate insulation layer GI and the interlayer insulation layer ILD.

The second conductive pattern CP2 may be a third conductive layer provided and/or formed on the interlayer insulation layer ILD. The second conductive pattern CP2 and the first conductive pattern CP1 may be provided and/or formed on the same layer.

One end (or first end) of the second conductive pattern CP2 may be electrically connected to the initialization power line IPL through a contact hole. As an example, one end of the second conductive pattern CP2 may be electrically and/or physically connected to the initialization power line IPL through a contact hole sequentially penetrating the buffer layer BFL, the gate insulation layer GI, and the interlayer insulation layer ILD.

The other end (or second end) of the second conductive pattern CP2 may be electrically connected to the third transistor T3 of the second pixel circuit SPXC2 through another contact hole. For example, the other end of the second conductive pattern CP2 may be electrically connected to a third drain area DE3 of the third transistor T3 of the second pixel circuit SPXC2 through a contact hole sequentially penetrating the gate insulation layer GI and the interlayer insulation layer ILD.

The third conductive pattern CP3 may be a third conductive layer provided and/or formed on the interlayer insulation layer ILD. The third conductive pattern CP3 and the first conductive pattern CP1 may be provided and/or formed on the same layer.

One end (or first end) of the third conductive pattern CP3 may be connected to the initialization power line IPL through a contact hole. As an example, one end of the third conductive pattern CP3 may be electrically and/or physically connected to the initialization power line IPL through a contact hole sequentially penetrating the buffer layer BFL, the gate insulation layer GI, and the interlayer insulation layer ILD.

The other end (or second end) of the third conductive pattern CP3 may be electrically connected to the third transistor T3 of the third pixel circuit SPXC3 through another contact hole. For example, the other end of the third conductive pattern CP3 may be electrically connected to a third drain area DE3 of the third transistor T3 of the third pixel circuit SPXC3 through a contact hole sequentially penetrating the gate insulation layer GI and the interlayer insulation layer ILD.

The first power line PL1, the second power line PL2, the initialization power line IPL, the sub-scan line SS1, the first scan line S1, and the second scan line S2 described above may be common components commonly provided in the first to third pixel circuits SPXC1, SPXC2, and SPXC3.

Each of the first to third pixel circuits SPXC1, SPXC2, and SPXC3 may include the first transistor T1, the second transistor T2, the third transistor T3, and the storage capacitor. For example, the first pixel circuit SPXC1 may include the first to third transistors T1, T2, and T3, and the first storage capacitor Cst1. The second pixel circuit SPXC2 may include the first to third transistors T1, T2, and T3, and a second storage capacitor Cst2. The third pixel circuit SPXC3 may include the first to third transistors T1, T2, and T3, and the third storage capacitor Cst3.

The first transistor T1 of each of the first to third pixel circuits SPXC1, SPXC2, and SPXC3 may be the first transistor T1 described with reference to FIG. 4, and the second transistor T2 of each of the first to third pixel circuits SPXC1, SPXC2, and SPXC3 may be the second transistor T2 described with reference to FIG. 4, and the third transistor T3 of each of the first to third pixel circuits SPXC1, SPXC2, and SPXC3 may be the third transistor T3 described with reference to FIG. 4.

The first to third pixel circuits SPXC1, SPXC2, and SPXC3 may have substantially a similar or the same structure. Hereinafter, the first pixel circuit SPXC1 among the first to third pixel circuits SPXC1, SPXC2, and SPXC3 will be described as a representative, and the second and third pixel circuits SPXC2 and SPXC3 will be briefly described.

The first pixel circuit SPXC1 includes the first transistor T1, the second transistor T2, the third transistor T3, and the first storage capacitor Cst1.

The first transistor T1 may include a first gate electrode GE1, a first active pattern ACT1, a first source area SE1, and a first drain area DE1.

The first gate electrode GE1 may be electrically connected to a second source area SE2 of the second transistor T2 through a fourth conductive pattern CP4. The first gate electrode GE1 may be a second conductive layer provided and/or formed on the gate insulation layer GI. The first gate electrode GE1 and the sub-scan line SS1 may be provided and/or formed on the same layer.

The fourth conductive pattern CP4 may be a third conductive layer. One end (or first end) of the fourth conductive pattern CP4 may be electrically connected to the first gate electrode GE1 through a contact hole. For example, one end of the fourth conductive pattern CP4 may be electrically and/or physically connected to the first gate electrode GE1 through a contact hole penetrating the interlayer insulation layer ILD. The other end (or second end) of the fourth conductive pattern CP4 may be electrically connected to the second source area SE2 through another contact hole. As an example, the other end of the fourth conductive pattern CP4 may be electrically and/or physically connected to the second source area SE2 through a contact hole sequentially penetrating the gate insulation layer GI and the interlayer insulation layer ILD.

The first active pattern ACT1, the first source area SE1, and the first drain area DE1 may be semiconductor patterns made of polysilicon, an amorphous silicon, an oxide semiconductor, or the like. The first active pattern ACT1, the first source area SE1, and the first drain area DE1 may be formed of a semiconductor layer in which an impurity is not doped or an impurity is doped. For example, the first source area SE1 and the first drain area DE1 may be formed of a semiconductor layer in which an impurity is doped, and the first active pattern ACT1 may be formed of a semiconductor layer in which an impurity is not doped.

The first active pattern ACT1, the first source area SE1, and the first drain area DE1 may be provided and/or formed on the buffer layer BFL.

The first active pattern ACT1 is an area overlapping the first gate electrode GE1, and may be a channel area of the first transistor T1. In case that the first active pattern ACT1 is formed to be long, the channel area of the first transistor T1 may be formed to be long. In this case, a driving range of a predetermined voltage applied to the first transistor T1 may be widened. Accordingly, it is possible to finely control a grayscale of light emitted from the light emitting elements LD.

The first source area SE1 may be electrically connected to (or may contact) one end (or first end) of the first active pattern ACT1. The first source area SE1 may be electrically connected to a first lower metal layer BML1 through a contact hole penetrating the buffer layer BFL.

The first lower metal layer BML1 may be a first conductive layer provided and/or formed on the substrate SUB. The first lower metal layer BML1 and the first to third data lines D1, D2, and D3, the first layer FL of the first power line PL1, the 2a-th power line PL2a, the first conductive line CL1 of each of the (2-1)-th and (2-2)-th scan lines S2_1 and S2_2, and the initialization power line IPL may be provided and/or formed on the same layer. The first lower metal layer BML1 may be electrically and/or physically connected to the first source area SE1 through a contact hole. In case that the first lower metal layer BML1 is electrically connected to the first transistor T1, a swing width margin of the second driving power source VSS may be further secured. In this case, a driving range of a predetermined voltage supplied to the first gate electrode GE1 of the first transistor T1 may be widened.

The first drain area DE1 may be electrically connected to (or may contact) the other end (or second end) of the first active pattern ACT1. The first drain area DE1 may be electrically connected to the first power line PL1 through a contact hole. For example, the first drain area DE1 may be electrically and/or physically connected to the first layer FL of the first power line PL1 through a contact hole penetrating the buffer layer BFL.

The second transistor T2 may include a second gate electrode GE2, a second active pattern ACT2, a second source area SE2, and a second drain area DE2.

The second gate electrode GE2 may be provided integrally with the sub-scan line SS1. In this case, the second gate electrode GE2 may be an area of the sub-scan line SS1. As described above, since the sub-scan line SS1 is electrically connected to the first scan line S1 through the contact hole, a signal (for example, a scan signal) applied to the first scan line S1 may be finally supplied to the second gate electrode GE2.

The second active pattern ACT2, the second source area SE2, and the second drain area DE2 may be semiconductor patterns made of polysilicon, an amorphous silicon, an oxide semiconductor, or the like. The second active pattern ACT2, the second source area SE2, and the second drain area DE2 may be formed of a semiconductor layer in which an impurity is not doped or an impurity is doped. For example, the second source area SE2 and the second drain area DE2 may be formed of a semiconductor layer in which an impurity is doped, and the second active pattern ACT2 may be formed of a semiconductor layer in which an impurity is not doped. The second active pattern ACT2, the second source area SE2, and the second drain area DE2 may be provided and/or formed on the buffer layer BFL.

The second active pattern ACT2 is an area overlapping the second gate electrode GE2, and may be a channel area of the second transistor T2.

The second source area SE2 may be electrically connected to (or may contact) one end of the second active pattern ACT2. The second source area SE2 may be electrically connected to the first gate electrode GE1 through the fourth conductive pattern CP4.

The second drain area DE2 may be electrically connected to (or may contact) the other end of the second active pattern ACT2. The second drain area DE2 may be electrically connected to the first data line D1 through a fifth conductive pattern CP5.

The fifth conductive pattern CP5 may be a third conductive layer provided and/or formed on the interlayer insulation layer ILD. One end (or first end) of the fifth conductive pattern CP5 may be electrically and/or physically connected to the first data line D1 through a contact hole sequentially penetrating the buffer layer BFL, the gate insulation layer GI, and the interlayer insulation layer ILD. The other end (or second end) of the fifth conductive pattern CP5 may be electrically connected to the second drain area DE2 through a contact hole sequentially penetrating the gate insulation layer GI and the interlayer insulation layer ILD. The second drain area DE2 and the first data line D1 may be electrically connected through the fifth conductive pattern CP5.

The third transistor T3 may include a third gate electrode GE3, a third active pattern ACT3, a third source area SE3, and a third drain area DE3.

The third gate electrode GE3 may be provided integrally with the sub-scan line SS1. In this case, the third gate electrode GE3 may be the other area of the sub-scan line SS1. As described above, since the sub-scan line SS1 is electrically connected to the first scan line S1 through the contact hole, a signal (for example, a control signal) applied to the first scan line S1 may be finally supplied to the third gate electrode GE3.

The third active pattern ACT3, the third source area SE3, and the third drain area DE3 may be semiconductor patterns made of polysilicon, an amorphous silicon, an oxide semiconductor, or the like. The third active pattern ACT3, the third source area SE3, and the third drain area DE3 may be formed of a semiconductor layer which is doped with an impurity or not doped with an impurity. For example, the third source area SE3 and the third drain area DE3 may be formed of a semiconductor layer which is doped with an impurity, and the third active pattern ACT3 may be formed of a semiconductor layer which is not doped with an impurity.

The third active pattern ACT3, the third source area SE3, and the third drain area DE3 may be provided and/or formed on the buffer layer BFL.

The third active pattern ACT3 is an area overlapping the third gate electrode GE3 and may be a channel area of the third transistor T3.

The third source area SE3 may be electrically connected to (or may contact) one end (or first end) of the third active pattern ACT3. The third source area SE3 may be electrically and/or physically connected to the first lower metal layer BML1 through a contact hole penetrating the buffer layer BFL.

The third drain area DE3 may be electrically connected to (or may contact) the other end (or second end) of the third active pattern ACT3. The third drain area DE3 may be electrically connected to the initialization power line IPL through the first conductive pattern CP1.

The first storage capacitor Cst1 may include a first lower electrode LE1 and a first upper electrode UE1. The first storage capacitor Cst1 may be the storage capacitor Cst described with reference to FIG. 4.

The first lower electrode LE1 may be provided integrally with the first gate electrode GE1. In this case, the first lower electrode LE1 may be an area of the first gate electrode GE1.

In a plan view, the first upper electrode UE1 is disposed to overlap the first lower electrode LE1, and may have a larger size (or area) than the first lower electrode LE1, but the disclosure is not limited thereto. The first upper electrode UE1 may overlap each of the first source area SE1 and the third source area SE3 in a plan view. The first upper electrode UE1 may be a third conductive layer provided and/or formed on the interlayer insulation layer ILD.

The first upper electrode UE1 may be electrically and/or physically connected to the first lower metal layer BML1 through a contact hole sequentially penetrating the buffer layer BFL, the gate insulation layer GI, and the interlayer insulation layer ILD. As described above, since the first source area SE1 and the third source area SE3 are electrically connected to the first lower metal layer BML1, the first upper electrode UE1 may be electrically and/or physically connected to the first and third source areas SE1 and SE3 through the first lower metal layer BML1.

In some embodiments, the first pixel circuit SPXC1 may be disposed to overlap the first light emitting part EMU1 and/or the second light emitting part EMU2. The first pixel circuit SPXC1 may not overlap the third light emitting part EMU3, but the disclosure is not limited thereto. For example, the first storage capacitor Cst1 may be disposed to overlap the first light emitting part EMU1 and/or the second light emitting part EMU2. The first storage capacitor Cst1 may not overlap the third light emitting part EMU3, but the disclosure is not limited thereto.

The first pixel circuit SPXC1 may be electrically connected to the first light emitting part EMU1. For example, the first light emitting part EMU1 may be electrically connected to the first upper electrode UE1 of the first storage capacitor Cst1 through a first via hole VIH1.

The second pixel circuit SPXC2 may include the first transistor T1, the second transistor T2, the third transistor T3, and the second storage capacitor Cst2.

The first transistor T1 may include the first gate electrode GE1, the first active pattern ACT1, the first source area SE1, and the first drain area DE1.

The first gate electrode GE1 may be electrically connected to the second source area SE2 of the second transistor T2.

The first active pattern ACT1 may be a channel area of the first transistor T1.

The first source area SE1 may be electrically connected to the first active pattern ACT1. The first source area SE1 may be electrically and/or physically connected to a second lower metal layer BML2 through a contact hole penetrating the buffer layer BFL.

The second lower metal layer BML2 may correspond to the first lower metal layer BML1. The second lower metal layer BML2 may be a first conductive layer provided and/or formed on the substrate SUB. The second lower metal layer BML2 may be electrically and/or physically connected to the first source area SE1 through a contact hole. The second lower metal layer BML2 may be electrically and/or physically connected to the third source area SE3 of the third transistor T3 through another contact hole penetrating the buffer layer BFL. Additionally, the second lower metal layer BML2 may be electrically and/or physically connected to a second upper electrode UE2 through another contact hole sequentially penetrating the buffer layer BFL, the gate insulation layer GI, and the interlayer insulation layer ILD.

The first drain area DE1 may be electrically connected to the first active pattern ACT1. The first drain area DE1 may be electrically and/or physically connected to the first layer FL of the first power line PL1 through another contact hole penetrating the buffer layer BFL.

The second transistor T2 may include the second gate electrode GE2, the second active pattern ACT2, the second source area SE2, and the second drain area DE2.

The second gate electrode GE2 is provided integrally with the sub-scan line SS1 and may be electrically connected to the first scan line S1.

The second active pattern ACT2 may be a channel area of the second transistor T2.

The second source area SE2 may be electrically connected to the second active pattern ACT2. The second source area SE2 may be electrically connected to the first gate electrode GE1 through a sixth conductive pattern CP6.

The sixth conductive pattern CP6 may be a third conductive layer provided and/or formed on the interlayer insulation layer ILD. One end (or first end) of the sixth conductive pattern CP6 may be electrically and/or physically connected to the second source area SE2 through a contact hole sequentially penetrating the gate insulation layer GI and the interlayer insulation layer ILD. The other end (or second end) of the sixth conductive pattern CP6 may be electrically connected to the first gate electrode GE1 through a contact hole penetrating the interlayer insulation layer ILD.

The second drain area DE2 may be electrically connected to the second active pattern ACT2. The second drain area DE2 may be electrically connected to the second data line D2 through a seventh conductive pattern CP7.

The seventh conductive pattern CP7 may be a third conductive layer provided and/or formed on the interlayer insulation layer ILD. One end (or first end) of the seventh conductive pattern CP7 may be electrically and/or physically connected to the second data line D2 through a contact hole sequentially penetrating the buffer layer BFL, the gate insulation layer GI, and the interlayer insulation layer ILD. The other end (or second end) of the seventh conductive pattern CP7 may be electrically and/or physically connected to the second drain area DE2 through a contact hole sequentially penetrating the gate insulation layer GI and the interlayer insulation layer ILD.

The third transistor T3 may include the third gate electrode GE3, the third active pattern ACT3, the third source area SE3, and the third drain area DE3.

The third gate electrode GE3 is provided integrally with the sub-scan line SS1 and may be electrically connected to the first scan line S1.

The third active pattern ACT3 may be a channel area of the third transistor T3.

The third source area SE3 may be electrically connected to the third active pattern ACT3. The third source area SE3 may be electrically and/or physically connected to the second lower metal layer BML2 through a contact hole.

The third drain area DE3 may be electrically connected to the third active pattern ACT3. The third drain area DE3 may be electrically connected to the initialization power line IPL through the second conductive pattern CP2.

The second storage capacitor Cst2, and the first storage capacitor Cst1 of the first pixel circuit SPXC1 described above may have substantially the same or similar structure. For example, the second storage capacitor Cst may include a second lower electrode LE2 and the second upper electrode UE2.

The second lower electrode LE2 may be a second conductive layer and may be provided integrally with (or integral with) the first gate electrode GE1 of the second transistor T2. The second upper electrode UE2 may be a third conductive layer and may overlap the second lower electrode LE2. The second upper electrode UE2 may be electrically and/or physically connected to the second lower metal layer BML2 through a contact hole.

As described above, the second upper electrode UE2 may be electrically connected to each of the first source area SE1 and the third source area SE3 through the second lower metal layer BML2.

In some embodiments, the second pixel circuit SPXC2 may be disposed to overlap the first light emitting part EMU1 and/or the second light emitting part EMU2. The second pixel circuit SPXC2 may not overlap the third light emitting part EMU3, but the disclosure is not limited thereto. For example, the second storage capacitor Cst2 may be disposed to overlap the first light emitting part EMU1 and/or the second light emitting part EMU2. The second storage capacitor Cst2 may not overlap the third light emitting part EMU3, but the disclosure is not limited thereto.

The second pixel circuit SPXC2 may be electrically connected to the second light emitting part EMU2. For example, the second light emitting part EMU2 may be electrically connected to a first connection line CNL1 through the first via hole VIH1, and may be electrically connected to the second pixel circuit SPXC2 through the first connection line CNL1.

The first connection line CNL1 may be a third conductive layer provided on the interlayer insulation layer ILD. The first connection line CNL1 and the first scan line S1, the second layer SL of the first power line PL1, and/or the 2b-th power line PL2b may be provided on the same layer.

For example, the first connection line CNL1 may be provided integrally with the second upper electrode UE2 of the second storage capacitor Cst2. For example, a portion of the second upper electrode UE2 of the second storage capacitor Cst2 may partially extend to configure the first connection line CNL1. Accordingly, the first connection line CNL1 may be electrically connected to the second storage capacitor Cst2 and the first to third transistors T1, T2, and T3 of the second pixel circuit SPXC2.

In an embodiment, the first connection line CNL1 may not overlap the sub-scan line SS1 described above. The first connection line CNL1 may be disposed to bypass one end (or first end) of the sub-scan line SS1. Therefore, in case that the first connection line CNL1 is disposed to bypass the sub-scan line SS1 so that it does not overlap the sub-scan line SS1, it is possible to reduce parasitic capacitance between the first connection line CNL1 and the sub-scan line SS1, thereby providing excellent image quality.

The third pixel circuit SPXC3 may include the first transistor T1, the second transistor T2, the third transistor T3, and the third storage capacitor Cst3.

The first transistor T1 may include the first gate electrode GE1, the first active pattern ACT1, the first source area SE1, and the first drain area DE1.

The first gate electrode GE1 may be electrically connected to the second source area SE2 of the third transistor T3.

The first active pattern ACT1 may be a channel area of the first transistor T1.

The first source area SE1 may be electrically connected to the first active pattern ACT1. The first source area SE1 may be electrically and/or physically connected to a third lower metal layer BML3 through a contact hole penetrating the buffer layer BFL.

The third lower metal layer BML3 may have a configuration corresponding to each of the first and second lower metal layers BML1 and BML2. The third lower metal layer BML3 may be a first conductive layer. The third lower metal layer BML3 may be electrically and/or physically connected to the first source area SE1 through a contact hole. The third lower metal layer BML3 may be electrically and/or physically connected to the third source area SE3 of the third transistor T3 through another contact hole penetrating the buffer layer BFL. Additionally, the third lower metal layer BML3 may be electrically and/or physically connected to a third upper electrode UE3 through another contact hole sequentially penetrating the buffer layer BFL, the gate insulation layer GI, and the interlayer insulation layer ILD.

The first drain area DE1 may be electrically connected to the first active pattern ACT1. The first drain area DE1 may be electrically and/or physically connected to the first layer FL of the first power line PL1 through another contact hole penetrating the buffer layer BFL.

The second transistor T2 may include the second gate electrode GE2, the second active pattern ACT2, the second source area SE2, and the second drain area DE2.

The second gate electrode GE2 may be provided integrally with the sub-scan line SS1 to be electrically connected to the first scan line S1.

The second active pattern ACT2 may be a channel area of the second transistor T2.

The second source area SE2 may be electrically connected to the second active pattern ACT2. The second source area SE2 may be electrically and/or physically connected to the third lower metal layer BML3 through a contact hole.

The second drain area DE2 may be electrically connected to the second active pattern ACT2. The second drain area DE2 may be electrically connected to the third data line D3 through an eighth conductive pattern CP8.

The eighth conductive pattern CP8 may be a third conductive layer provided and/or formed on the interlayer insulation layer ILD. One end (or first end) of the eighth conductive pattern CP8 may be electrically and/or physically connected to the third data line D3 through a contact hole sequentially penetrating the buffer layer BFL, the gate insulation layer GI, and the interlayer insulation layer ILD. The other end (or second end) of the eighth conductive pattern CP8 may be electrically and/or physically connected to the second drain area DE2 through a contact hole sequentially penetrating the gate insulation layer GI and the interlayer insulation layer ILD. Accordingly, the second drain area DE2 and the third data line D3 may be electrically connected to each other through the eighth conductive pattern CP8.

The third transistor T3 may include the third gate electrode GE3, the third active pattern ACT3, the third source area SE3, and the third drain area DE3.

The third gate electrode GE3 is provided integrally with the sub-scan line SS1, and may be connected to the first scan line S1.

The third active pattern ACT3 may be a channel area of the third transistor T3.

The third source area SE3 may be electrically connected to the third active pattern ACT3. The third source area SE3 may be electrically connected to the first gate electrode GE1 through a ninth conductive pattern CP9.

The ninth conductive pattern CP9 may be a third conductive layer provided and/or formed on the interlayer insulation layer ILD. One end (or first end) of the ninth conductive pattern CP9 may be electrically and/or physically connected to the third source area SE3 through a contact hole sequentially penetrating the gate insulation layer GI and the interlayer insulation layer ILD. The other end (or second end) of the ninth conductive pattern CP9 may be electrically connected to the first gate electrode GE1 through a contact hole penetrating the interlayer insulation layer ILD. Accordingly, the first gate electrode GE1 and the third source area SE3 may be electrically connected to each other through the ninth conductive pattern CP9.

The third drain area DE3 may be electrically connected to the third active pattern ACT3. The third drain area DE3 may be electrically connected to the initialization power line IPL through the ninth conductive pattern CP9. In an embodiment, the third drain area DE3 of the third transistor T3 and the third drain area DE3 of the second transistor T2 may share the ninth conductive pattern CP9.

The third storage capacitor Cst3 and each of the first and second storage capacitors Cst1 and Cst2 described above may have substantially the same or similar structure. For example, the third storage capacitor Cst3 may include a third lower electrode LE3 and a third upper electrode UE3.

The third lower electrode LE3 may be a second conductive layer and may be provided integrally with the first gate electrode GE1 of the corresponding transistor, for example, the third transistor T3. The third upper electrode UE3 may be a third conductive layer and may overlap the third lower electrode LE3. The third upper electrode UE3 may be electrically and/or physically connected to the third lower metal layer BML3 through a contact hole. As described above, the third upper electrode UE3 may be electrically connected to each of the first source area SE1 and the third source area SE3 through the third lower metal layer BML3.

In some embodiments, the third pixel circuit SPXC3 may be disposed to overlap the first light emitting part EMU1 and/or the second light emitting part EMU2. The third pixel circuit SPXC3 may not overlap the third light emitting part EMU3, but the disclosure is not limited thereto. For example, the third storage capacitor Cst3 may be disposed to overlap the first light emitting part EMU1 and/or the second light emitting part EMU2. The third storage capacitor Cst3 may not overlap the third light emitting part EMU3, but the disclosure is not limited thereto.

The third pixel circuit SPXC3 may be electrically connected to the third light emitting part EMU3. For example, the third light emitting part EMU3 may be electrically connected to a second connection line CNL2 through the first via hole VIH1, and may be electrically connected to the third pixel circuit SPXC3 through the second connection line CNL2.

The second connection line CNL2 may be a third conductive layer provided on the interlayer insulation layer ILD. The second connection line CNL2 and the first scan line S1, the second layer SL of the first power line PL1, and/or the 2b-th power line PL2b may be provided on the same layer.

For example, the second connection line CNL2 may be provided integrally with the third upper electrode UE3 of the third storage capacitor Cst3. For example, a portion of the third upper electrode UE3 of the third storage capacitor Cst3 may partially extend to configure the second connection line CNL2. Accordingly, the second connection line CNL2 may be electrically connected to the third storage capacitor Cst3 and the first to third transistors T1, T2, and T3 of the third pixel circuit SPXC3.

In an embodiment, the second connection line CNL2 may not overlap the sub-scan line SS1 described above. The second connection line CNL2 may be disposed to bypass the other end (or second end) of the sub-scan line SS1. For example, the sub-scan line SS1 may be disposed between the first connection line CNL1 and the second connection line CNL2 described above.

Therefore, in case that the second connection line CNL2 is disposed to bypass the sub-scan line SS1 so that the second connection line CNL2 does not overlap the sub-scan line SS1, it is possible to reduce parasitic capacitance between the second connection line CNL2 and the sub-scan line SS1, so that excellent image quality may be provided as described above.

The buffer layer BFL may be disposed between the first conductive layer and the first to third active patterns ACT1, ACT2, and ACT3 described above. The buffer layer BFL may prevent impurities from spreading to each of the first to third pixel circuits SPXC1, SPXC2, and SPXC3. The buffer layer BFL may be configured as a single layer or multilayer and may include at least one of various types of inorganic materials such as a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), and a titanium oxide ($TiO_x$).

The gate insulation layer GI may be disposed between the first to third active patterns ACT1, ACT2, and ACT3 and the second conductive layer. The gate insulation layer GI may be configured as a single layer or multilayer and may include at least one of various types of inorganic materials such as a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), and a titanium oxide ($TiO_x$).

The interlayer insulation layer ILD may be disposed between the second conductive layer and the third conductive layer. The interlayer insulation layer ILD may be configured as a single layer or multilayer and may include at least one of various types of inorganic materials such as a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), and a titanium oxide ($TiO_x$).

The passivation layer PSV and the via layer VIA may be disposed on the third conductive layer.

The passivation layer PSV may be configured as a single layer or multilayer and may include at least one of various types of inorganic materials such as a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), and a titanium oxide ($TiO_x$).

The via layer VIA may be disposed on the passivation layer PSV. The via layer VIA may be made of an organic material to flatten a lower step thereof. For example, the via layer VIA may include an organic material such as an acrylates resin, an epoxy resin, a phenolic resin, a polyamides resin, a polyimides resin, a polyesters resin, a polyphenylenesulfides resin, or a benzocyclobutene (BCB). However, the disclosure is not limited thereto, and the via layer VIA may include at least one of various types of inorganic materials such as a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), and a titanium oxide ($TiO_x$).

The passivation layer PSV may include first via holes VIH1 and second via holes VIH2.

Each of the first via holes VIH1 may expose one area of the first upper electrode UE1 of the first storage capacitor Cst1, one area of the first connection line CNL1, and one area of the second connection line CNL2. Each of the second via holes VIH2 may expose one area of the 2b-th power line PL2b.

The pixel area PXA may include the first light emitting area EMA1, the second light emitting area EMA2, and the third light emitting area EMA3. The first light emitting area EMA1, the second light emitting area EMA2, and the third light emitting area EMA3 may form the light emitting area EMA of the pixel PXL.

The first light emitting part EMU1 disposed in the first light emitting area EMA1 may be electrically connected to the first pixel circuit SPXC1 described above. For example, the first light emitting area EMA1 may be an area in which light is emitted from the light emitting elements LD driven by the first pixel circuit SPXC1. In an embodiment, the first light emitting area EMA1 may be a light emitting area of the first sub-pixel SPXL1.

The second light emitting part EMU2 disposed in the second light emitting area EMA2 may be electrically connected to the second pixel circuit SPXC2 described above. The second light emitting area EMA2 may be an area from which light is emitted by the light emitting elements LD driven by the second pixel circuit SPXC2. In an embodiment, the second light emitting area EMA2 may be a light emitting area of the second sub-pixel SPXL2.

The third light emitting part EMU3 disposed in the third light emitting area EMA3 may be electrically connected to the third pixel circuit SPXC3 described above. The third light emitting area EMA3 may be an area in which light is emitted from the light emitting elements LD driven by the third pixel circuit SPXC3. In an embodiment, the third light emitting area EMA3 may be a light emitting area of the third sub-pixel SPXL3.

For example, the first light emitting area EMA1, the second light emitting area EMA2, and the third light emitting area EMA3 may be partitioned in the first direction DR1. For example, the second light emitting part EMU2 may be disposed between the first light emitting part EMU1 and the third light emitting part EMU3.

The pixel area PXA may include the non-light emitting area NEMA adjacent to the first light emitting area EMA1 (or surrounding a periphery of the first light emitting area EMA1), the non-light emitting area NEMA adjacent to the second light emitting area EMA2 (or surrounding a periphery of the second light emitting area EMA2), and the non-light emitting area NEMA adjacent to the third light emitting area EMA3 (or surrounding a periphery of the third light emitting area EMA3).

The bank BNK may be disposed in the non-light emitting area NEMA. The bank BNK is a structure defining the first to third light emitting areas EMA1, EMA2, and EMA3 of each of the first to third sub-pixels SPXL1, SPXL2, and SPXL3, and may be, for example, a pixel defining film. The bank BNK may be disposed in an area between the first to third light emitting areas EMA1, EMA2, and EMA3 and outside the first to third light emitting areas EMA1, EMA2, and EMA3.

The bank BNK may be a dam structure that defines each light emitting area EMA in which the light emitting elements LD should be supplied in a process of supplying the light emitting elements LD to the pixel PXL. For example, the first to third light emitting areas EMA1, EMA2, and EMA3 are partitioned by the bank BNK, so that a mixed solution (for example, ink) including a desired amount and/or type of light emitting elements LD may be provided or injected into each of the first to third light emitting areas EMA1, EMA2, and EMA3.

The bank BNK may include opening areas OPa and OPb exposing components disposed therebelow in the pixel area PXA. For example, the bank BNK may include a first opening area OPa and a second opening area OPb exposing components disposed therebelow in the pixel area PXA. In an embodiment, the first to third light emitting areas EMA1, EMA2, and EMA3 may be defined by the first opening areas OPa of the bank BNK. The first to third light emitting areas EMA1, EMA2, and EMA3 may correspond to the first opening areas OPa of the bank BNK, respectively.

The second opening area OPb of the bank BNK may be disposed to be spaced apart from the first opening area OPa, and may be disposed to be spaced apart from each of upper and lower sides of the first opening area OPa.

As the bank BNK is disposed in the non-light emitting area NEMA between the first to third light emitting areas EMA1, EMA2, and EMA3, a supply (or injection) area of the light emitting elements LD in the pixel area PXA may be determined. Accordingly, in a step of supplying the light emitting elements LD to the pixel PXL, the light emitting elements LD are prevented from being supplied to unnecessary areas, and the light emitting elements LD may be efficiently supplied to each of the first to third light emitting areas EMA1, EMA2, and EMA3. Accordingly, it is possible to prevent the light emitting elements LD from being wasted, and to reduce the manufacturing cost of the display device.

In the first to third light emitting areas EMA1, EMA2, and EMA3 (or first to third sub-pixel areas SPXA1, SPXA2, and SPXA3), first to third alignment electrodes ELT1, ELT2, and ELT3 may be disposed, respectively.

The first to third alignment electrodes ELT1, ELT2, and ELT3 may extend in the second direction DR2 and may be spaced apart from each other in the first direction DR1. For example, the first to third alignment electrodes ELT1, ELT2, and ELT3 may be sequentially arranged in an opposite direction of the first direction DR1 on the via layer VIA. The first to third alignment electrodes ELT1, ELT2, and ELT3 may be a fourth conductive layer provided and/or formed on the via layer VIA.

The first to third alignment electrodes ELT1, ELT2, and ELT3 may be made of a material having a constant reflectance in order to direct light emitted from each of the light emitting elements LD in an image display direction or a front direction of the display device (for example, the third direction DR3). For example, the first to third alignment electrodes ELT1, ELT2, and ELT3 may be made of a conductive material (or substance) having a constant reflectivity. The conductive material (or substance) may include an opaque metal that is advantageous in reflecting light emitted by the light emitting elements LD in the image display direction of the display device (for example, the third direction DR3). The opaque metal may include, for example, silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof. In some embodiments, the first to third alignment electrodes ELT1, ELT2, and ELT3 may include a transparent conductive material (or substance). The transparent conductive material (or substance) may include a conductive oxide such as an indium tin oxide (ITO), an indium zinc oxide (IZO), a zinc oxide (ZnO), an indium gallium zinc oxide (IGZO), or an indium tin zinc oxide (ITZO), and a conductive polymer such as poly(3,4-ethylenedioxythiophene) (PEDOT). In case that the first to third alignment electrodes ELT1, ELT2, and ELT3 include a transparent conductive material (or substance), a separate conductive layer made of an opaque metal for reflecting the light emitted from the light emitting elements LD in the image display direction of the display device may be added. However, the materials of the first to third alignment electrodes ELT1, ELT2, and ELT3 are not limited to the above-described materials.

Each of the first to third alignment electrodes ELT1, ELT2, and ELT3 may be provided and/or formed as a single layer, but the disclosure is not limited thereto. In some embodiments, each of the first to third alignment electrodes ELT1, ELT2, and ELT3 may be provided and/or formed as a multi-film in which at least two or more materials of metals, alloys, conductive oxides, and conductive polymers are stacked. Each of the first to third alignment electrodes ELT1, ELT2, and ELT3 may be formed of a multilayer including at least two or more layers to minimize distortion caused by signal delay in case that a signal (or voltage) is transmitted to respective end portions of each of the light emitting elements LD. For example, each of the first to third alignment electrodes ELT1, ELT2, and ELT3 may be formed as a multi-film sequentially stacked in an order of indium tin oxide (ITO)/silver (Ag)/indium tin oxide (ITO).

Connection patterns CNP may be further disposed in each of the first to third sub-pixel areas SPXA1, SPXA2, and SPXA3. The connection patterns CNP may be a fourth conductive layer provided and/or formed on the via layer VIA. For example, the connection patterns CNP and the first to third alignment electrodes ELT1, ELT2, and ELT3 described above may be provided and/or formed on the same layer.

The connection patterns CNP of the first to third sub-pixel areas SPXA1, SPXA2, and SPXA3 may be electrically connected to the above-mentioned first to third pixel circuits SPXC1, SPXC2, and SPXC3 through the first via hole VIH1, respectively. For example, the connection pattern CNP of the first sub-pixel area SPXA1 may be electrically connected to the first pixel circuit SPXC1 through the first via hole VIH1. For example, the connection pattern CNP of the first sub-pixel area SPXA1 may be electrically connected to the first upper electrode UE1 of the first storage capacitor Cst1 through the first via hole VIH1.

The connection pattern CNP of the second sub-pixel area SPXA2 may be electrically connected to the second pixel circuit SPXC2 through the first via hole VIH1. For example, the connection pattern CNP of the second sub-pixel area SPXA2 may be electrically connected to the first connection line CNL1 through the first via hole VIH1, and may be electrically connected to the second upper electrode UE2 of the second storage capacitor Cst2 through the first connection line CNL1.

The connection pattern CNP of the third sub-pixel area SPXA3 may be electrically connected to the third pixel circuit SPXC3 through the first via hole VIH1. For example, the connection pattern CNP of the third sub-pixel area SPXA3 may be electrically connected to the second connection line CNL2 through the first via hole VIH1, and may be electrically connected to the third upper electrode UE3 of the third storage capacitor Cst3 through the second connection line CNL2.

Each of the third alignment electrodes ELT3 of the first to third sub-pixel areas SPXA1, SPXA2, and SPXA3 may be electrically connected to different areas of the 2b-th power line PL2b described above through the second via holes VIH2.

Each of the first to third alignment electrodes ELT1, ELT2, and ELT3 may be used as an alignment electrode (or an alignment wire) for aligning the light emitting elements LD, which is supplied with an alignment signal before the light emitting elements LD are aligned in the light emitting area EMA of the pixel PXL.

In the alignment step of the light emitting elements LD, the first alignment electrode ELT1 may receive the first alignment signal, the second alignment electrode ELT2 may receive the second alignment signal, and the third alignment electrode ELT3 may receive the first alignment signal. The above-described first and second alignment signals may be signals having a predetermined voltage difference and/or a predetermined phase difference so that light emitting elements LD may be aligned between the first to third alignment electrodes ELT1, ELT2, and ELT3. At least one of the first and second alignment signals may be an alternating current (AC) signal, but the disclosure is not limited thereto.

After the light emitting elements LD are aligned in each of the first to third light emitting areas EMA1, EMA2, and EMA3, in order to independently (or individually) drive each of the first to third sub-pixels SPXL1, SPXL2, and SPXL3 from sub-pixels adjacent thereto in the second direction DR2, a portion of each of the first to third alignment electrodes ELT1, ELT2, and ELT3 disposed between the sub-pixels SPXL adjacent thereto in the second direction DR2 is removed, so that an end portion thereof may be disposed in each second opening area OPb of the bank BNK.

After the light emitting elements LD are aligned in each of the first to third light emitting areas EMA1, EMA2, and EMA3, each of the first to third alignment electrodes ELT1, ELT2, and ELT3 may be used as a driving electrode for driving the light emitting elements LD.

In some embodiments, bank patterns BNP may be disposed between the via layer VIA and the first to third alignment electrodes ELT1, ELT2, and ELT3. The bank patterns BNP may have various shapes according to embodiments. In an embodiment, the bank patterns BNP may have a shape protruding in the third direction DR3 on the substrate SUB. The bank patterns BNP may be formed to have an inclined surface inclined at a predetermined angle with respect to the substrate SUB. However, the disclosure is not limited thereto, and the bank patterns BNP may have a side wall having a curved surface or a step shape. For example, the bank patterns BNP may have a cross-section of a semicircle or semi-ellipse shape.

The bank patterns BNP may include at least one organic and/or inorganic material. For example, the bank patterns BNP may include an organic material such as an acrylates resin, an epoxy resin, a phenolic resin, a polyamides resin, a polyimides rein, a polyesters resin, a polyphenylenesulfides resin, or a benzocyclobutene (BCB). However, the disclosure is not limited thereto, and the bank patterns BNP may include at least one of various types of inorganic materials such as a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), and a titanium oxide ($TiO_x$).

Electrodes and insulation layers disposed at an upper portion of the bank patterns BNP may have a shape corresponding to the bank patterns BNP. For example, the first to third alignment electrodes ELT1, ELT2, and ELT3 disposed on the bank patterns BNP may include an inclined surface or a curved surface having a shape corresponding to the shapes of the bank patterns BNP. Accordingly, the bank patterns BNP, along with the first to third alignment electrodes ELT1, ELT2, and ELT3 provided thereon, may function as a reflective member that guides the light emitted from the light emitting elements LD in a front direction of the pixel PXL, for example, the third direction DR3 to improve the light emitting efficiency of the display panel PNL.

The first insulation layer INS1 may be provided and/or formed on the first to third alignment electrodes ELT1, ELT2, and ELT3 and the connection pattern CNP. For example, the first insulation layer INS1 may be disposed on a surface of the substrate SUB to cover the first to third alignment electrodes ELT1, ELT2, and ELT3 and the connection pattern CNP.

The first insulation layer INS1 may be configured as a single layer or multilayer and may include at least one of various types of inorganic materials such as a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), and a titanium oxide ($TiO_x$).

The bank BNK may be disposed on the first insulation layer INS1. In the step of supplying the light emitting elements LD to each of the first to third light emitting areas EMA1, EMA2, and EMA3, the bank BNK may form a dam structure partitioning light emitting areas to which the light emitting elements LD should be supplied. For example, a desired type and/or amount of light emitting element ink may be supplied to an area partitioned by the bank BNK.

The bank BNK may include an organic material such as an acrylates resin, an epoxy resin, a phenolic resin, a polyamides resin, a polyimides rein, a polyesters resin, a polyphenylenesulfides resin, or a benzocyclobutene (BCB). However, the disclosure is not limited thereto, and the bank BNK may include at least one of various types of inorganic materials such as a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), and a titanium oxide ($TiO_x$).

In some embodiments, the bank BNK may include at least one light blocking and/or reflective material. Accordingly, light leakage between adjacent sub-pixels SPXL may be prevented. For example, the bank BNK may include a black matrix material and/or a color filter material. For example, the bank BNK may be formed in a black opaque pattern that may block transmission of light. In an embodiment, a reflective film (not shown) may be formed on a surface (for example, a side wall) of the bank BNK to increase the light efficiency of each sub-pixel SPXL.

The light emitting elements LD may be disposed on the first insulation layer INS1. The light emitting elements LD may be disposed between the first to third alignment electrodes ELT1, ELT2, and ELT3 on the first insulation layer INS1. The light emitting elements LD may be prepared in a dispersed form in the light emitting element ink, and may be supplied to each of the first to third light emitting areas EMA1, EMA2, and EMA3 by an inkjet printing method or the like. For example, the light emitting elements LD may be dispersed in a volatile solvent to be provided in each sub-pixel SPXL. Subsequently, in case that an alignment signal is supplied to the first to third alignment electrodes ELT1, ELT2, and ELT3, an electric field is formed between the first to third alignment electrodes ELT1, ELT2, and ELT3, so that the light emitting elements LD may be aligned between the first to third alignment electrodes ELT1, ELT2, and ELT3. After the light emitting elements LD are aligned, the light emitting elements LD may be stably arranged between the first to third alignment electrodes ELT1, ELT2, and ELT3 by volatilizing the solvent or eliminating it in other ways.

The first light emitting elements LD1 may be disposed between the first alignment electrode ELT1 and the second alignment electrode ELT2. The second light emitting elements LD2 may be disposed between the second alignment electrode ELT2 and the third alignment electrode ELT3. The first light emitting elements LD1 may be aligned in the same direction between the first alignment electrode ELT1 and the second alignment electrode ELT2. The second light emitting elements LD2 may be aligned in the same direction between the second alignment electrode ELT2 and the third alignment electrode ELT3.

The second insulation layer INS2 may be disposed on the first insulation layer INS1 and the light emitting elements LD. For example, the second insulation layer INS2 may be partially provided on the first insulation layer INS1 and the light emitting elements LD, and may expose the first and second ends EP1 and EP2 of the light emitting elements LD. In case that the second insulation layer INS2 is formed on the light emitting elements LD after the alignment of the light emitting elements LD is completed, it is possible to prevent the light emitting elements LD from deviating from an aligned position.

The second insulation layer INS2 may be configured as a single layer or multilayer and may include at least one of various types of inorganic materials such as a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), and a titanium oxide ($TiO_x$).

First to third connection electrodes CNE1, CNE2, and CNE3 may be disposed on the first and second end portions EP1 and EP2 of the light emitting elements LD exposed by the second insulation layer INS2.

The first connection electrode CNE1 may be disposed on the first end portions EP1 of the first light emitting elements LD1 to be electrically connected to the first end portions EP1 of the first light emitting elements LD1. The first connection electrode CNE1 may be electrically connected to the above-described connection pattern CNP through a contact hole passing through the second insulation layer INS2 and the first insulation layer INS1.

The second connection electrode CNE2 may be disposed on the second end portions EP2 of the second light emitting elements LD2 to be electrically connected to the second end portions EP2 of the second light emitting elements LD2. The second connection electrode CNE2 may be electrically connected to the third alignment electrode ELT3 through a contact hole passing through the second insulation layer INS2 and the first insulation layer INS1.

The third connection electrode CNE3 may be disposed on the second end portions EP2 of the first light emitting elements LD1 to be electrically connected to the second end portions EP2 of the first light emitting elements LD1. The third connection electrode CNE3 may be disposed on the first end portions EP1 of the second light emitting elements LD2 to be electrically connected to the first end portions EP1 of the second light emitting elements LD2. For example, the third connection electrode CNE3 may electrically connect the second end portions EP2 of the first light emitting elements LD1 and the first end portions EP1 of the second light emitting elements LD2 in the light emitting area EMA. For this, the third connection electrode CNE3 may have a curved shape. For example, the third connection electrode CNE3 may have a curved or bent structure at a boundary between an area in which at least one first light emitting element LD1 is arranged and an area in which at least one second light emitting element LD2 is arranged.

In an embodiment, each of the first and second connection electrodes CNE1 and CNE2 may extend from the light emitting area EMA to the second opening area OPb. The first connection electrode CNE1 may be electrically connected to the connection pattern CNP in the second opening area OPb, and may be electrically connected to the pixel circuits PXC described above through the connection pattern CNP. The second connection electrode CNE2 may be electrically connected to the third alignment electrode ELT3 in the second opening area OPb, and may be electrically connected to the 2b-th power line PL2b described above through the third alignment electrode ELT3.

The first connection electrode CNE1 may be the first electrode EL1 of the light emitting part EMU described with reference to FIG. 4, the second connection electrode CNE2 may be the second electrode EL2 of the light emitting part EMU described with reference to FIG. 4, and the third connection electrode CNE3 may be the middle electrode CTE of the light emitting part EMU described with reference to FIG. 4.

In an embodiment, the first to third connection electrodes CNE1, CNE2, and CNE3 may be disposed on different layers. For example, the first connection electrode CNE1 and/or the second connection electrode CNE2 may be a fifth conductive layer provided and/or formed on the second insulation layer INS2. The third connection electrode CNE3 may be a sixth conductive layer provided and/or formed on the fifth conductive layer. The third insulation layer INS3 may be disposed between the fifth conductive layer and the sixth conductive layer.

The third insulation layer INS3 may cover the first connection electrode CNE1 and/or the second connection electrode CNE2 formed of the fifth conductive layer, but may expose the second end portion EP2 of the light emitting elements LD. The third connection electrode CNE3 formed of the sixth conductive layer may be disposed on the second end portion EP2 of the light emitting element LD exposed by the third insulation layer INS3. As described above, in case that the third insulation layer INS3 is disposed between the fifth conductive layer and the sixth conductive layer, the first to third connection electrodes CNE1, CNE2, and CNE3 may be stably separated from each other by the third insulation layer INS3, so that electrical stability between the first and second end portions EP1 and EP2 of the light emitting elements LD may be secured.

Each of the first to third connection electrodes CNE1, CNE2, and CNE3 may be made of various transparent conductive materials. For example, each of the first to third connection electrodes CNE1, CNE2, and CNE3 may include at least one of various transparent conductive materials including an indium tin oxide (ITO), an indium zinc oxide (IZO), an indium tin zinc oxide (ITZO), an aluminum zinc oxide (AZO), a gallium zinc oxide (GZO), a zinc tin oxide (ZTO), and a gallium tin oxide (GTO), and may be provided to be substantially transparent or translucent to satisfy a predetermined light transmittance. Accordingly, the light emitted from the first and second end portions EP1 and EP2 of the light emitting elements LD may pass through the first to third connection electrodes CNE1, CNE2, and CNE3 to be emitted to the outside of the display panel PNL.

The third insulation layer INS3 may be configured as a single layer or multilayer and may include at least one of various types of inorganic materials such as a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), and a titanium oxide ($TiO_x$).

According to the above-described embodiment, the first and second connection lines CNL1 and CNL2 electrically connected to the light emitting part EMU are disposed to bypass the sub-scan line SS1 to not overlap the sub-scan line SS1, so that since the parasitic capacitance between the first and second connection lines CNL1 and CNL2 and the sub-scan line SS1 may be reduced, excellent image quality may be provided.

Hereinafter, other embodiments will be described. The same elements as those described above will be denoted by the same reference numerals in embodiments below, and repetitive descriptions thereof will be omitted or simplified.

Figure 9:
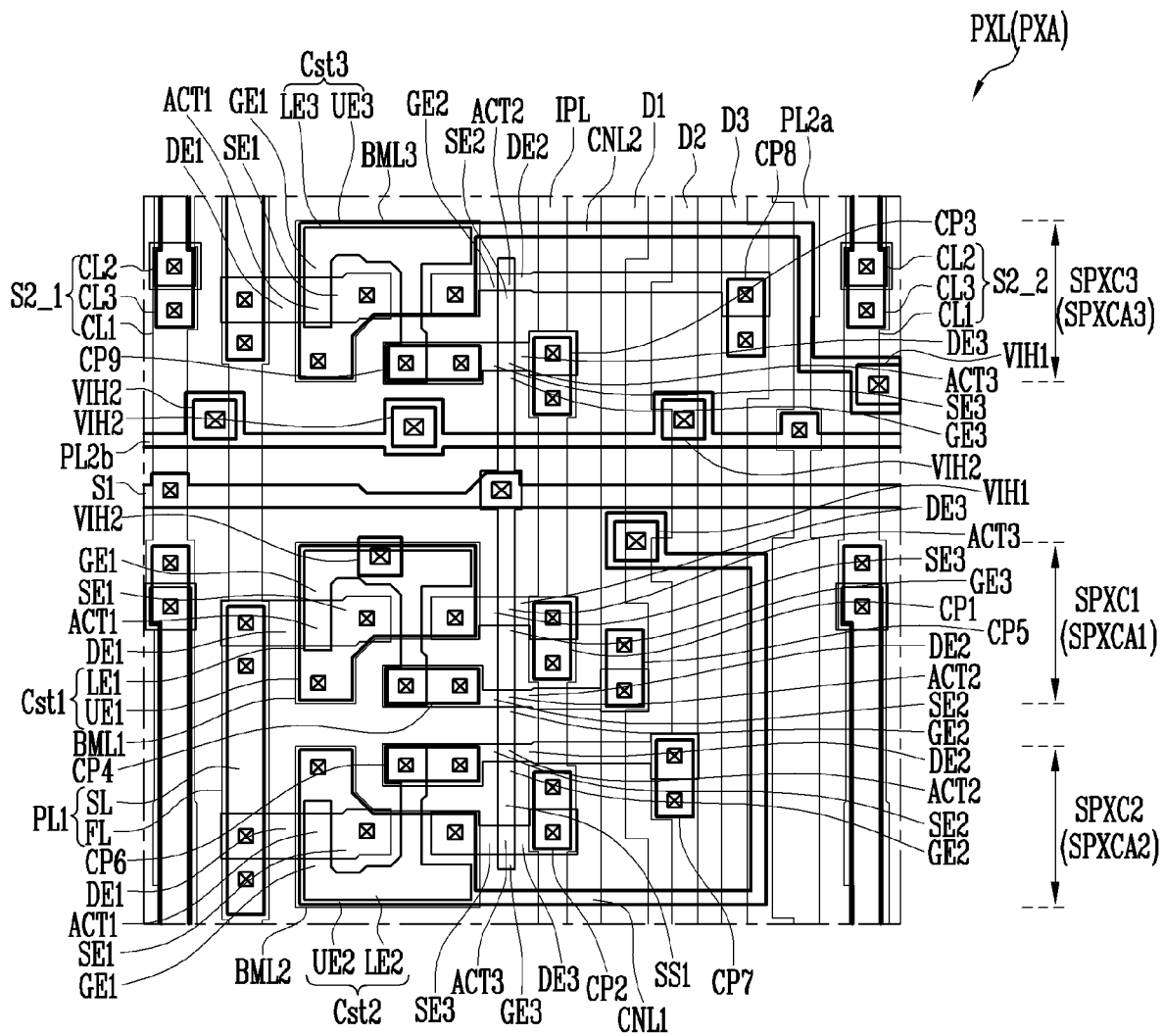
FIGS. 9 and 10 schematically illustrate plan views of a pixel circuit area according to another embodiment.
Figure 9:
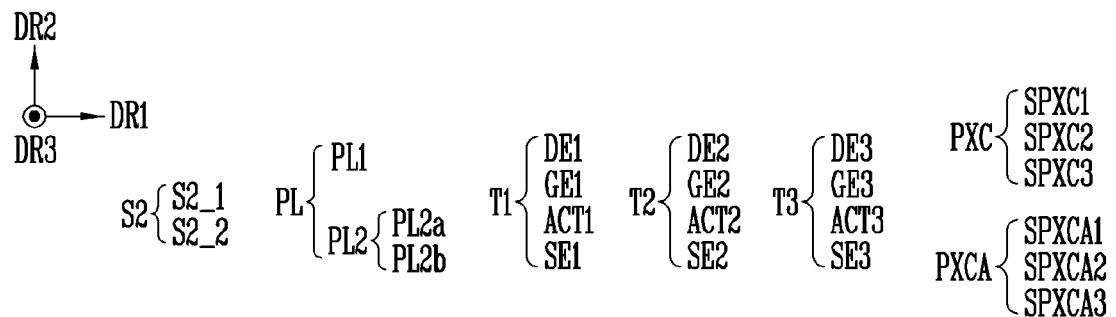
Figure 10:
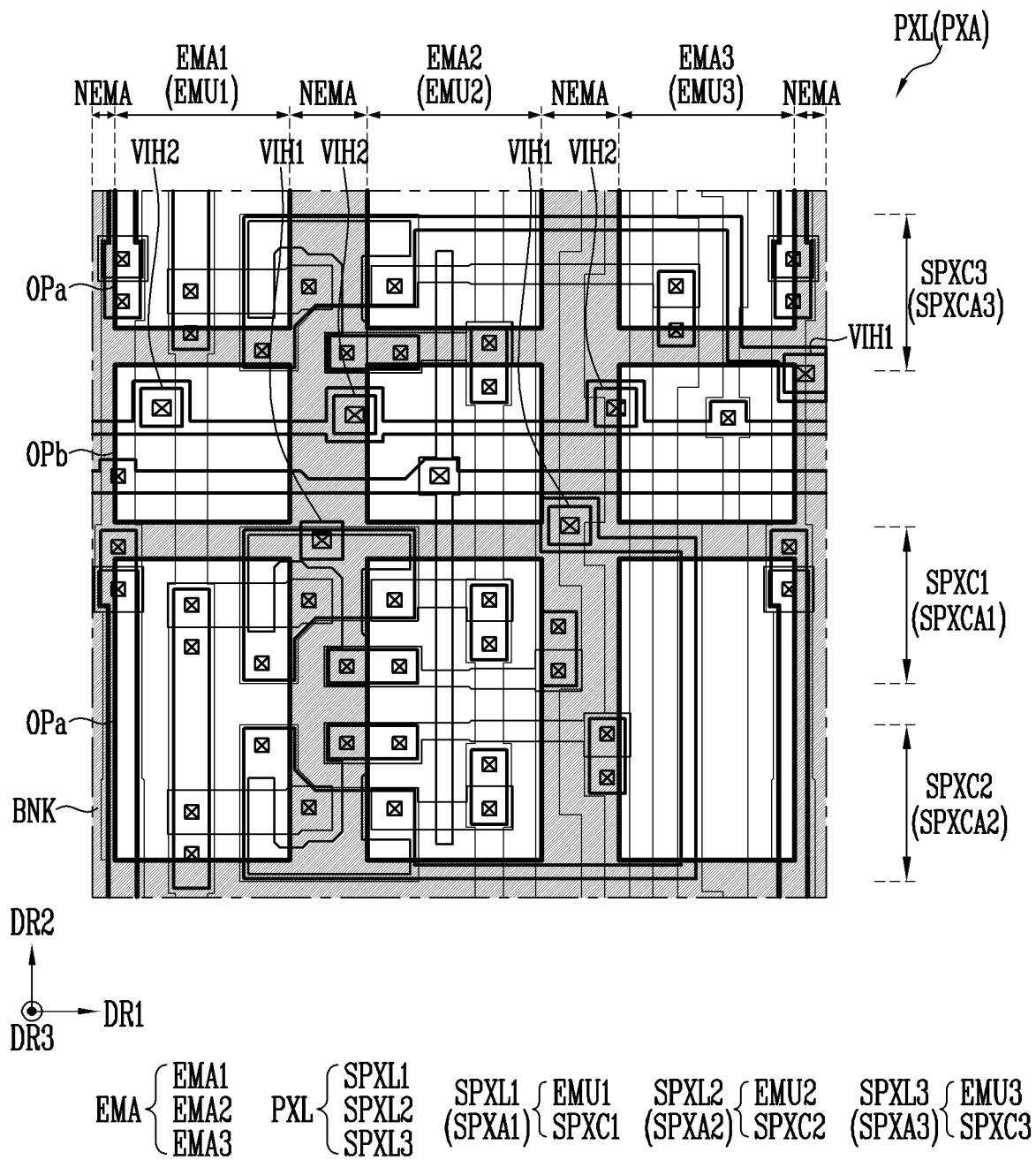
Figure 11:
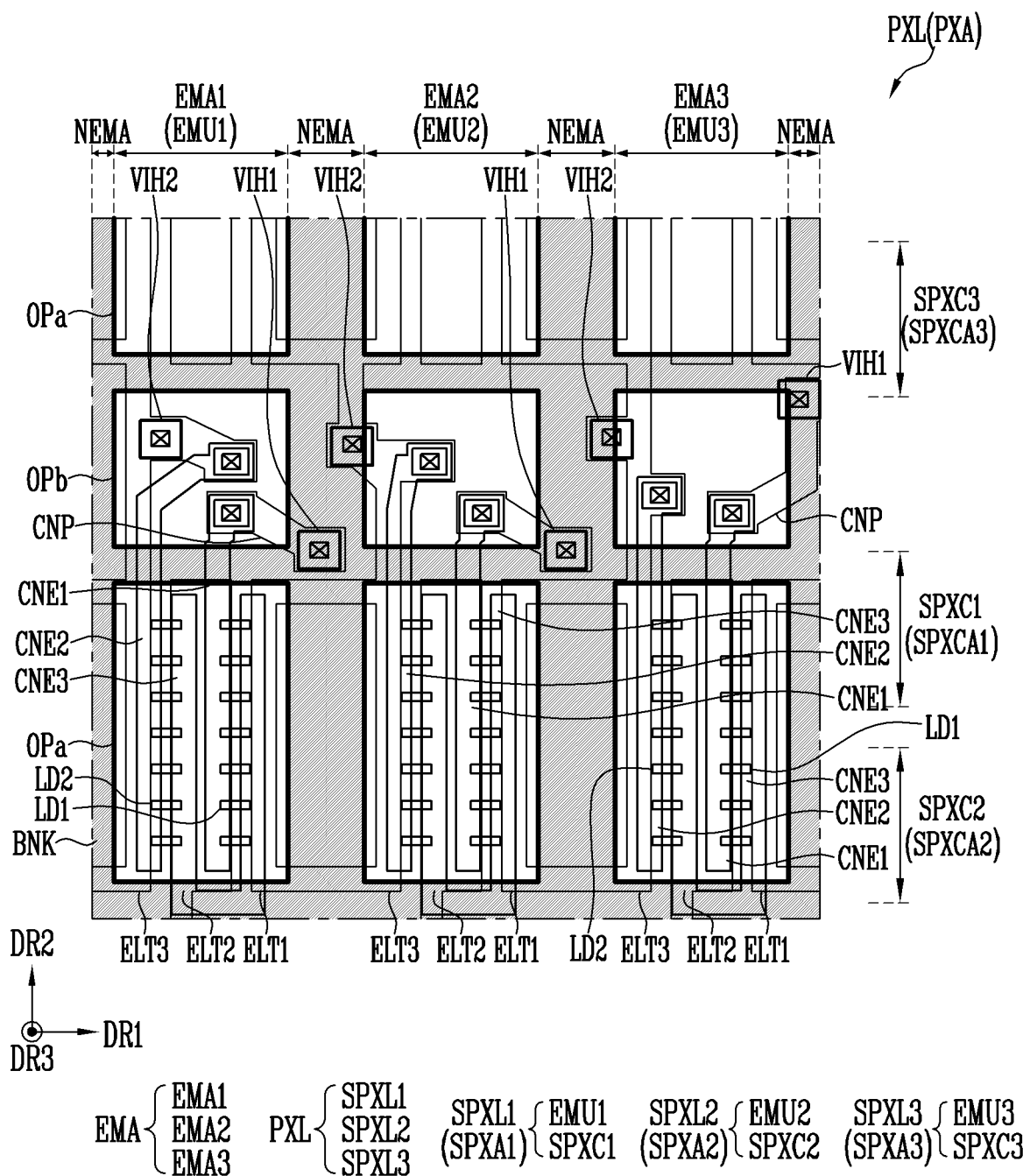
FIG. 11 schematically illustrates a plan view of a light emitting area according to another embodiment.

FIGS. 9 and 10 illustrate schematic plan views of a pixel circuit area according to another embodiment. FIG. 10 further includes a bank BNK compared to the embodiment of FIG. 9. FIG. 11 illustrates a schematic plan view of a light emitting area according to an embodiment.

Referring to FIGS. 9 to 11, a pixel circuit area PXCA according to the present embodiment is distinguished from the embodiment of FIGS. 1 to 8 at least in that it is partitioned in an order of the second pixel circuit area SPXCA2, the first pixel circuit area SPXCA1, and the third pixel circuit area SPXCA3 in the second direction DR2.

The first pixel circuit area SPXCA1 may be an area in which the first pixel circuit SPXC1 is provided, the second pixel circuit area SPXCA2 may be an area in which the second pixel circuit SPXC2 is provided, and the third pixel circuit area SPXCA3 may be an area in which the third pixel circuit SPXC3 is provided. For example, the second pixel circuit SPXC2, the first pixel circuit SPXC1, and the third pixel circuit SPXC3 may be sequentially disposed in the second direction DR2.

The light emitting area EMA may be partitioned in an order of the first light emitting area EMA1, the second light emitting area EMA2, and the third light emitting area EMA3 in the first direction DR1.

The first light emitting area EMA1 may be an area in which the first light emitting part EMU1 is provided, the second light emitting area EMA2 may be an area in which the second light emitting part EMU2 is provided, and the third light emitting area EMA3 may be an area in which the third light emitting part EMU3 is provided. For example, the first light emitting part EMU1, the second light emitting part EMU2, and the third light emitting part EMU3 may be sequentially disposed in the first direction DR1.

The first scan line S1 may extend in the first direction DR1 between the first to third pixel circuits SPXC1, SPXC2, and SPXC3. The first scan line S1 may extend in the first direction DR1 between the first pixel circuit SPXC1 and the third pixel circuit SPXC3. For example, the first scan line S1 may extend in the first direction DR1 between the first storage capacitor Cst1 and the third storage capacitor Cst3, but the disclosure is not limited thereto.

The first scan line S1 may be disposed on a sub-scan line SS1 to be electrically connected to the sub-scan line SS1 through a contact hole. For example, the first scan line S1 may be electrically and/or physically connected to the sub-scan line SS1 through a contact hole penetrating the interlayer insulation layer ILD.

The sub-scan line SS1 may extend in the second direction DR2. The sub-scan line SS1 may not overlap the first connection line CNL1 electrically connecting the second light emitting part EMU2 and the second pixel circuit SPXC2. The sub-scan line SS1 may not overlap the second connection line CNL2 electrically connecting the third light emitting part EMU3 and the third pixel circuit SPXC3. For example, the first connection line CNL1 may be disposed to bypass one end (or first end) of the sub-scan line SS1, and the second connection line CNL2 may be disposed to bypass the other end (or second end) of the sub-scan line SS1. Therefore, in case that the first and second connection lines CNL1 and CNL2 are disposed to bypass the sub-scan line SS1 to not overlap it, it is possible to reduce the parasitic capacitance between the first and second connection lines CNL1 and CNL2 and the sub-scan line SS1, so that excellent image quality may be provided as described above.

Figure 12:
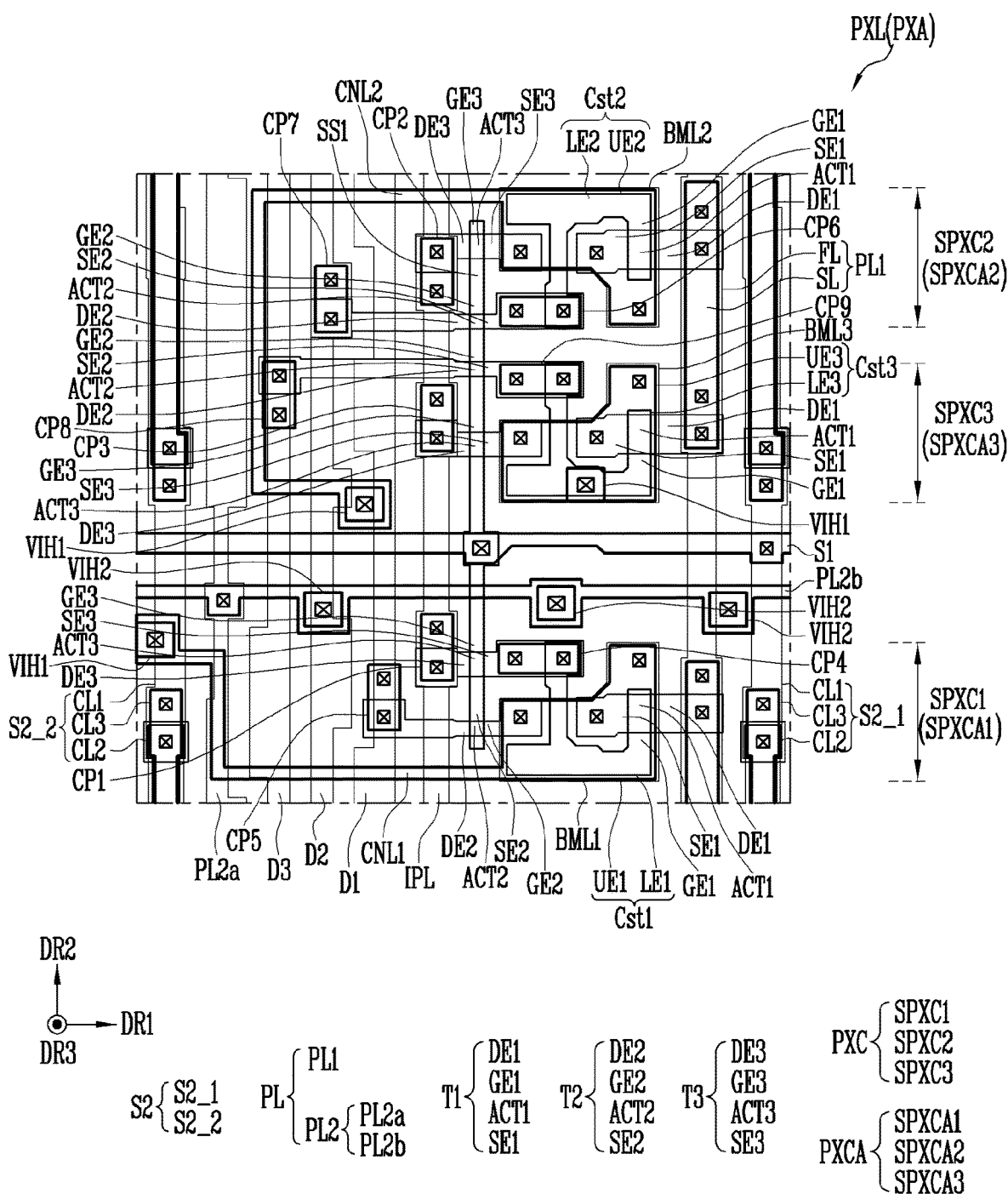
FIGS. 12 and 13 schematically illustrate plan views of a pixel circuit area according to another embodiment.
Figure 13:
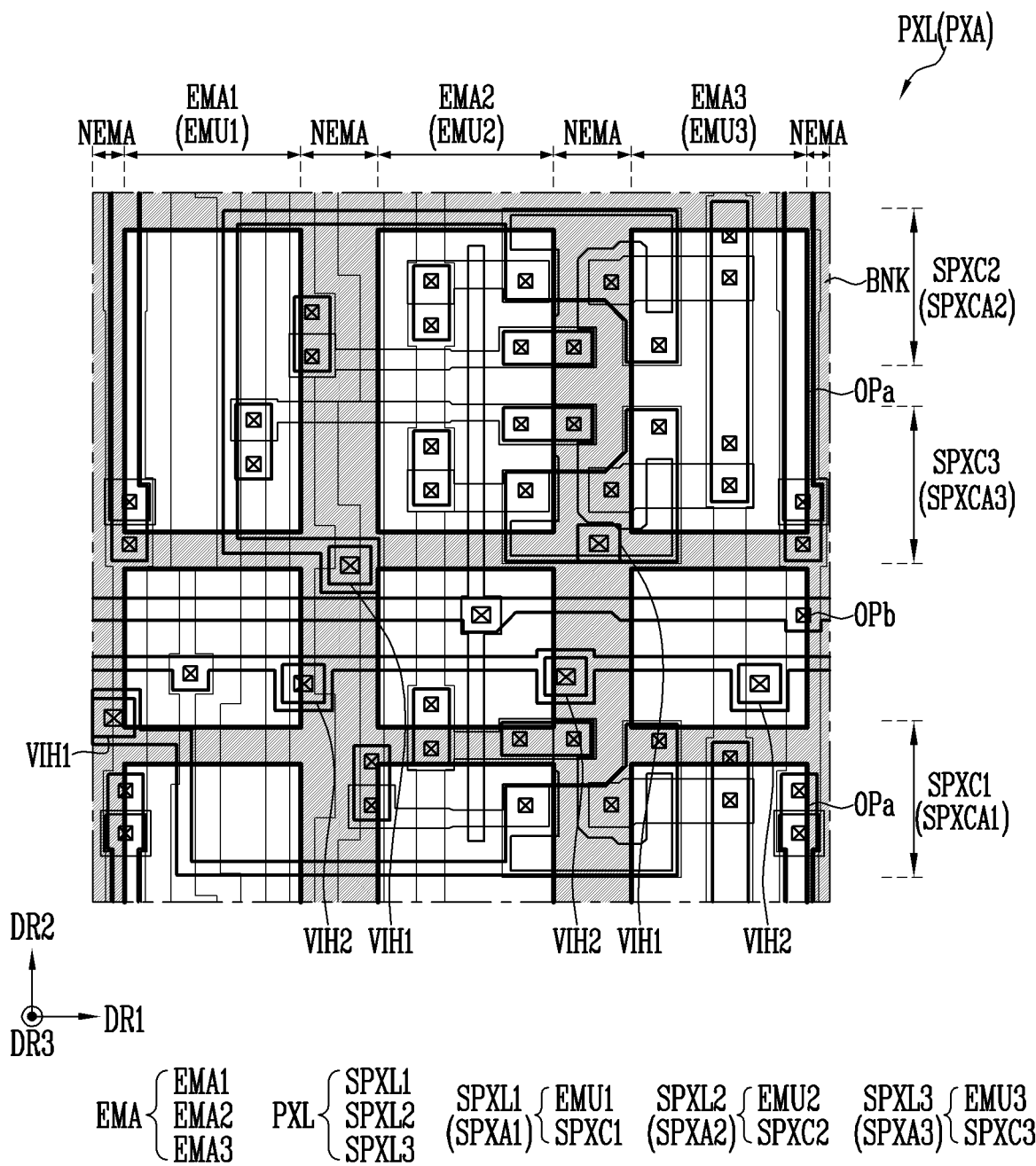
Figure 14:
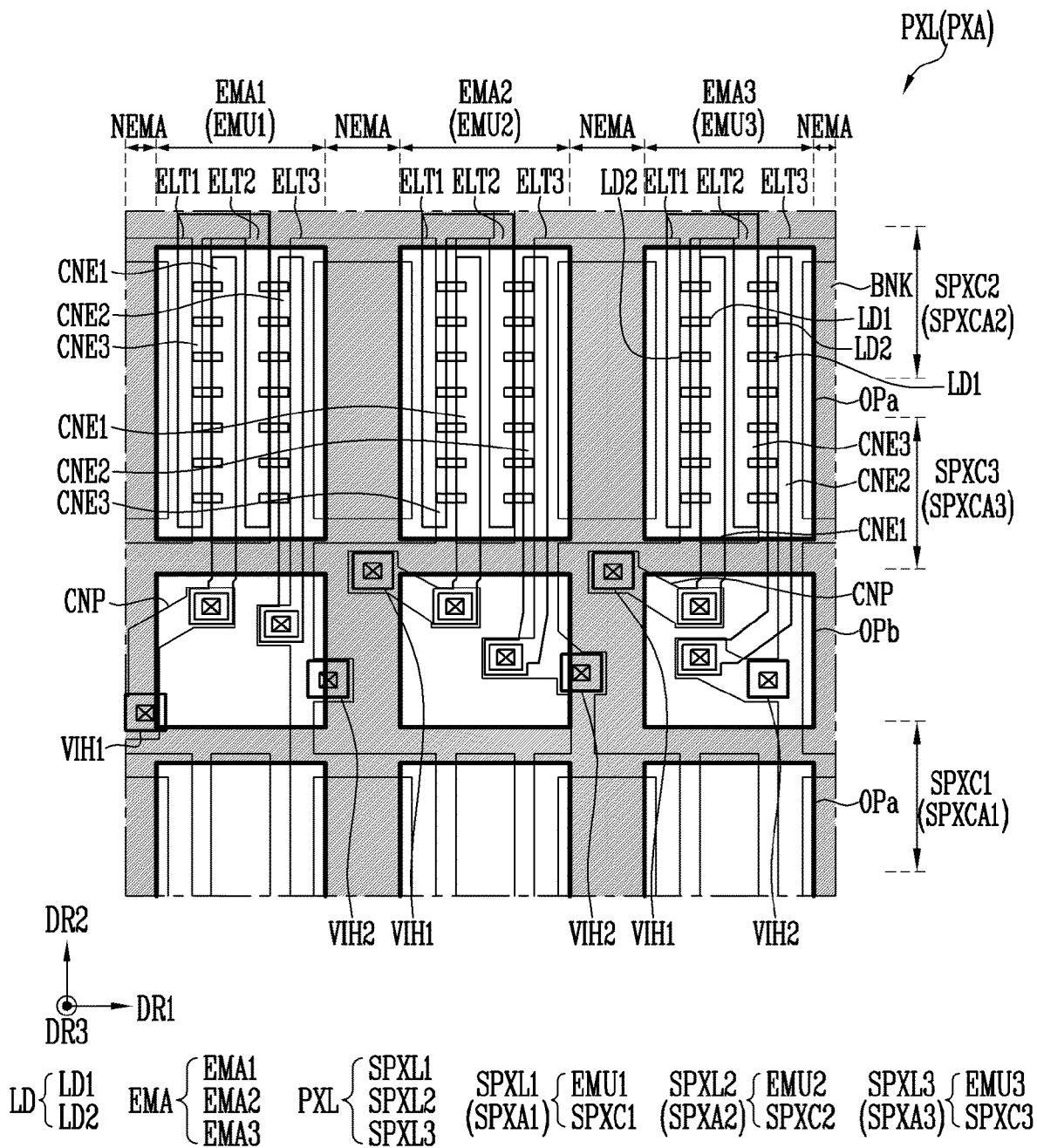
FIG. 14 schematically illustrates a plan view of a light emitting area according to another embodiment.

FIGS. 12 and 13 illustrate schematic plan views of a pixel circuit area according to embodiments. FIG. 13 further includes a bank BNK compared to the embodiment of FIG. 12. FIG. 14 illustrates a schematic plan view of a light emitting area according to an embodiment.

Referring to FIGS. 12 to 14, a pixel circuit area PXCA according to the present embodiment is distinguished from the embodiment of FIGS. 1 to 8 at least in that it is partitioned in an order of the first pixel circuit area SPXCA1, the third pixel circuit area SPXCA3, and the second pixel circuit area SPXCA2 in the second direction DR2.

The first pixel circuit area SPXCA1 may be an area in which the first pixel circuit SPXC1 is provided, the second pixel circuit area SPXCA2 may be an area in which the second pixel circuit SPXC2 is provided, and the third pixel circuit area SPXCA3 may be an area in which the third pixel circuit SPXC3 is provided. For example, the first pixel circuit SPXC1, the third pixel circuit SPXC3, and the second pixel circuit SPXC2 may be sequentially disposed in the second direction DR2.

The light emitting area EMA may be partitioned in an order of the first light emitting area EMA1, the second light emitting area EMA2, and the third light emitting area EMA3 in the first direction DR1.

The first light emitting area EMA1 may be an area in which the first light emitting part EMU1 is provided, the second light emitting area EMA2 may be an area in which the second light emitting part EMU2 is provided, and the third light emitting area EMA3 may be an area in which the third light emitting part EMU3 is provided. For example, the first light emitting part EMU1, the second light emitting part EMU2, and the third light emitting part EMU3 may be sequentially disposed in the first direction DR1.

The first pixel circuit SPXC1 may be electrically connected to the first light emitting part EMU1. For example, the first light emitting part EMU1 may be electrically connected to a first connection line CNL1 through the first via hole VIH1, and may be electrically connected to the first pixel circuit SPXC1 through the first connection line CNL1.

The first connection line CNL1 may be a third conductive layer provided on the interlayer insulation layer ILD. The first connection line CNL1 and the first scan line S1, the second layer SL of the first power line PL1, and/or the 2b-th power line PL2b may be provided on the same layer.

For example, the first connection line CNL1 may be provided integrally with the first upper electrode UE1 of the first storage capacitor Cst1. For example, a portion of the first upper electrode UE1 of the first storage capacitor Cst1 may partially extend to configure the first connection line CNL1. Accordingly, the first connection line CNL1 may be electrically connected to the first storage capacitor Cst1 and the first to third transistors T1, T2, and T3 of the first pixel circuit SPXC1.

The second pixel circuit SPXC2 may be electrically connected to the second light emitting part EMU2. For example, the second light emitting part EMU2 may be electrically connected to a second connection line CNL2 through the first via hole VIH1, and may be electrically connected to the second pixel circuit SPXC2 through the second connection line CNL2.

The second connection line CNL2 may be a third conductive layer provided on the interlayer insulation layer ILD. The second connection line CNL2 and the first scan line S1, the second layer SL of the first power line PL1, and/or the 2b-th power line PL2b may be provided on the same layer.

For example, the second connection line CNL2 may be provided integrally with the second upper electrode UE2 of the second storage capacitor Cst2. For example, a portion of the second upper electrode UE2 of the second storage capacitor Cst2 may partially extend to configure the second connection line CNL2. Accordingly, the second connection line CNL2 may be electrically connected to the second storage capacitor Cst2 and the first to third transistors T1, T2, and T3 of the second pixel circuit SPXC2.

In an embodiment, the first connection line CNL1 and/or the second connection line CNL2 may not overlap the sub-scan line SS1 described above. For example, the first connection line CNL1 may be disposed to bypass one end (or first end) of the sub-scan line SS1, and the second connection line CNL2 may be disposed to bypass the other end (or second end) of the sub-scan line SS1. Therefore, in case that the first and second connection lines CNL1 and CNL2 are disposed to bypass the sub-scan line SS1 to not overlap it, it is possible to reduce the parasitic capacitance between the first and second connection lines CNL1 and CNL2 and the sub-scan line SS1, so that excellent image quality may be provided as described above.

The third pixel circuit SPXC3 may be electrically connected to the third light emitting part EMU3. For example, the third light emitting part EMU3 may be electrically connected to the third upper electrode UE3 of the third storage capacitor Cst3 through a first via hole VIH1.

Each of the first to third pixel circuits SPXC1, SPXC2, and SPXC3 may be disposed to overlap the second light emitting part EMU2 and/or the third light emitting part EMU3. The first to third pixel circuits SPXC1, SPXC2, and SPXC3 may be not overlap the first light emitting part EMU1, but the disclosure is not limited thereto. For example, each of the first to third storage capacitors Cst1, Cst2, and Cst3 may be disposed to overlap the second light emitting part EMU2 and/or the third light emitting part EMU3. Each of the first to third storage capacitors Cst1, Cst2, and Cst3 may be not overlap the first light emitting part EMU1, but the disclosure is not limited thereto.

The first to third pixel circuits SPXC1, SPXC2, and SPXC3 may be disposed at the right side in the pixel PXL or the pixel area PXA based on the sub-scan line SS1. For example, the first to third storage capacitors Cst1, Cst2, and Cst3 may be disposed at the right side in the pixel PXL or the pixel area PXA based on the sub-scan line SS1.

Figure 15:
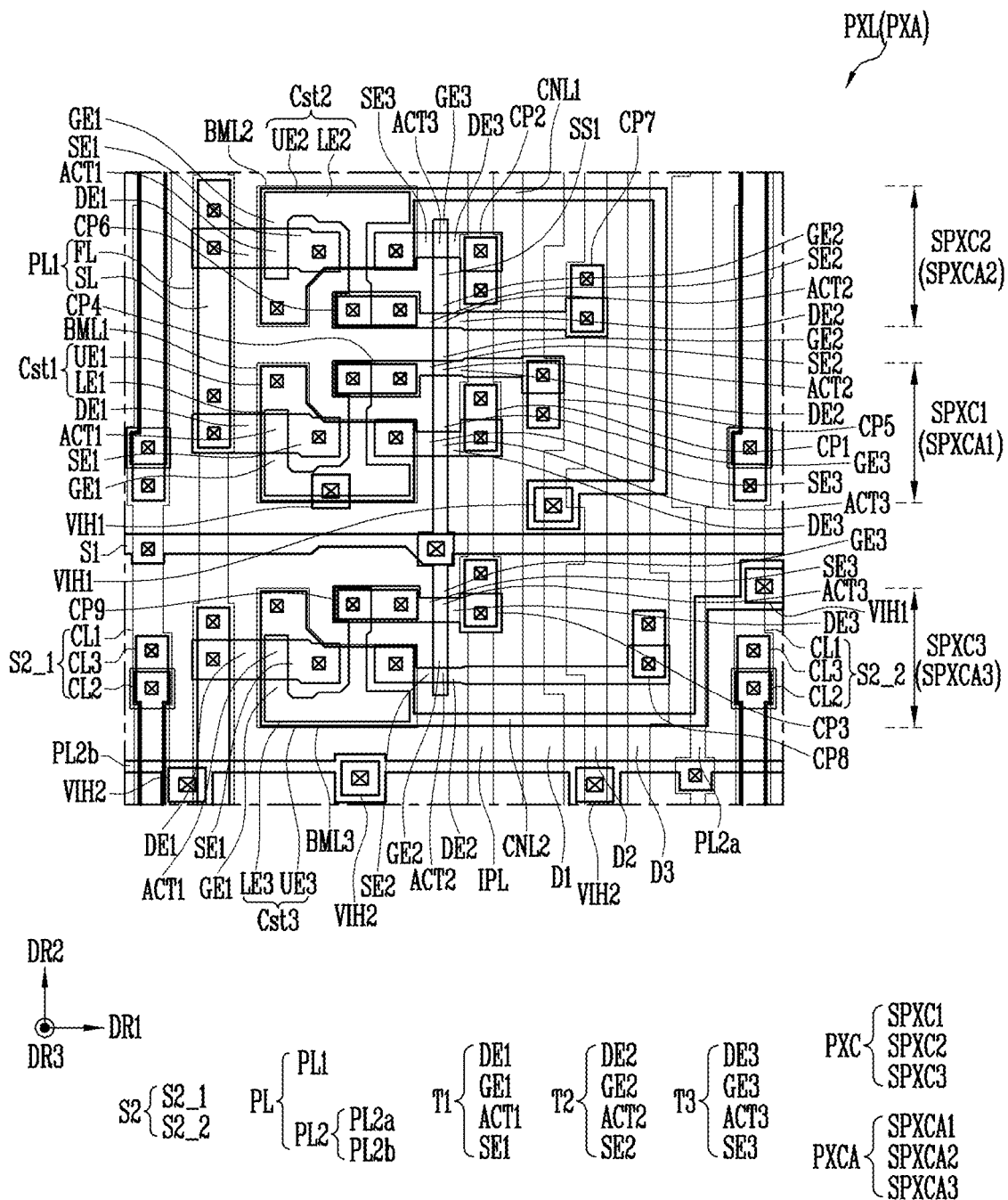
FIGS. 15 and 16 schematically illustrate plan views of a pixel circuit area according to another embodiment.
Figure 16:
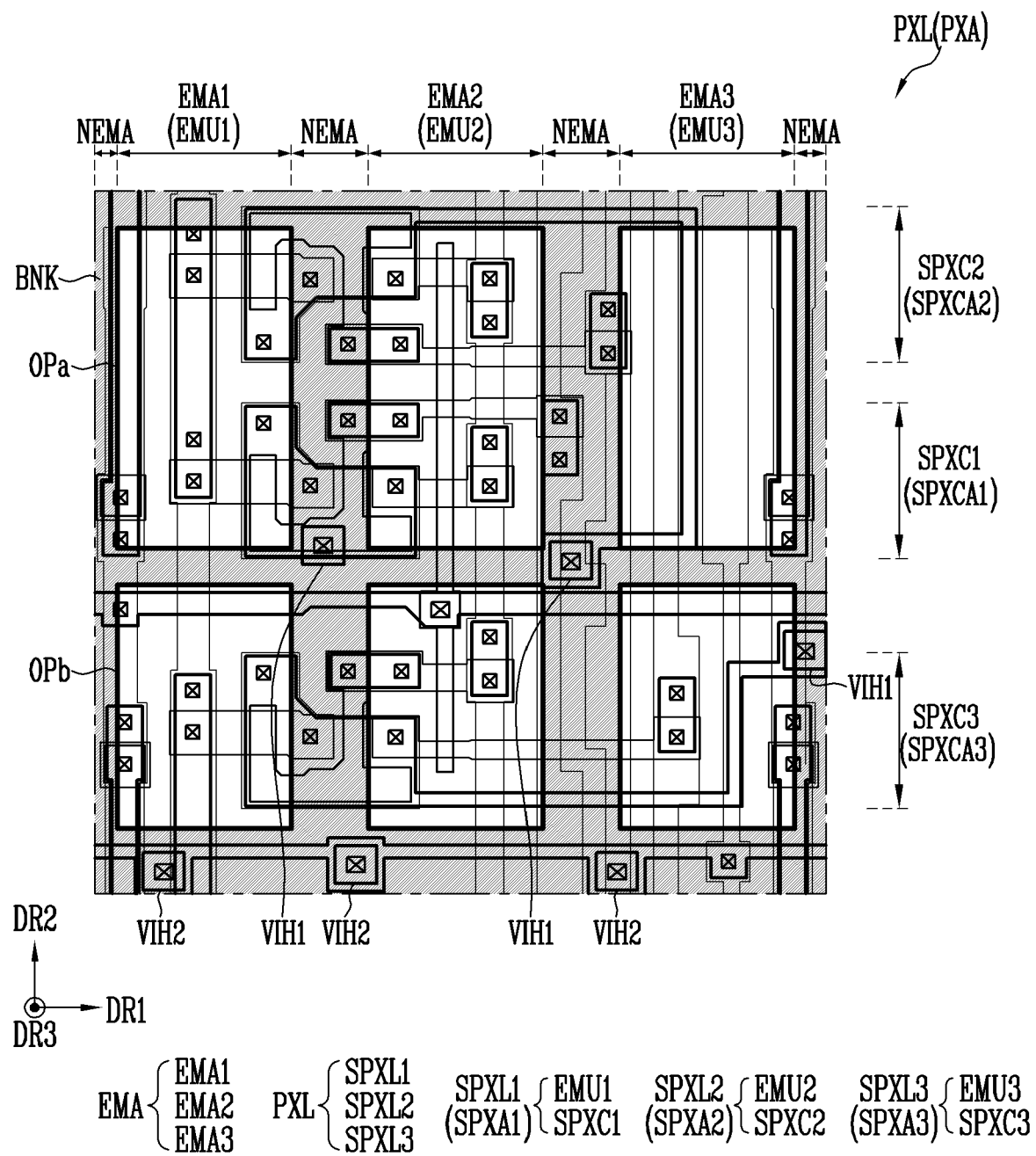
Figure 17:
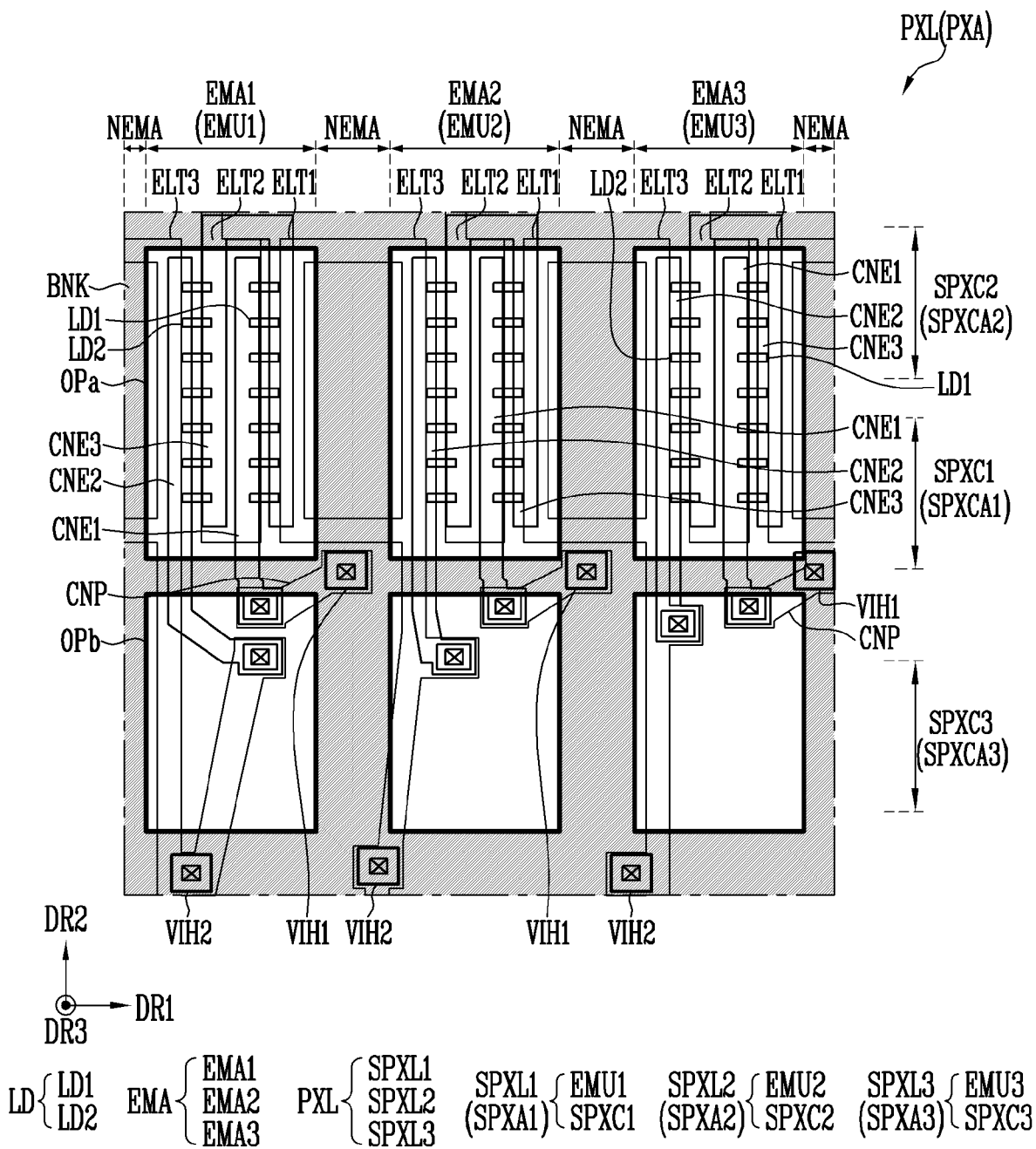
FIG. 17 schematically illustrates a plan view of a light emitting area according to another embodiment.

FIGS. 15 and 16 illustrate schematic plan views of a pixel circuit area according to embodiments. FIG. 16 further includes a bank BNK compared to the embodiment of FIG. 15. FIG. 17 illustrates a schematic plan view of a light emitting area according to an embodiment.

Referring to FIGS. 15 to 17, a pixel circuit area PXCA according to the present embodiment is distinguished from the embodiment of FIGS. 1 to 8 at least in that the third pixel circuit SPXC3 is disposed between the first scan line S1 and the 2b-th power line PL2b.

The first scan line S1 may extend in the first direction DR1. The first scan line S1 may be disposed at one side (or first side) of the third pixel circuit SPXC3. For example, the first scan line S1 may be disposed between the first pixel circuit SPXC1 and the third pixel circuit SPXC3. The first scan line S1 may be disposed at the other side (or second side) of the third storage capacitor Cst3. For example, the first scan line S1 may be disposed between the first storage capacitor Cst1 and the third storage capacitor Cst3, but the disclosure is not limited thereto.

The 2b-th power line PL2b may extend in the first direction DR1. The 2b-th power line PL2b may be disposed at the second side of the third pixel circuit SPXC3. As an example, the 2b-th power line PL2b may be disposed at a second side of the third storage capacitor Cst3. The 2b-th power line PL2b may be disposed to be spaced apart from the first scan line S1 with the third pixel circuit SPXC3 (or the third storage capacitor Cst3) interposed therebetween in a plan view.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:
   pixels, each of the pixels including:
   light emitting parts disposed in a first direction;
   pixel circuits for respective sub-pixels including storage capacitors disposed in a second direction intersecting the first direction;
   a scan line extending in the first direction between the storage capacitors of at least two sub-pixels of a respective one of the pixels, the scan line supplying at least a scan signal to the respective one of the pixels;
   a sub-scan line electrically connected to the scan line and extending in the second direction; and
   connection lines that electrically connect the light emitting parts and the pixel circuits and do not overlap the sub-scan line in a plan view, wherein
   the connection lines and the scan line are disposed on a same layer.

2. The display device of claim 1, wherein the pixel circuits include:
   a first pixel circuit including:
   a first storage capacitor; and
   at least one transistor electrically connected to the first storage capacitor;
   a second pixel circuit including:
   a second storage capacitor; and
   at least one transistor electrically connected to the second storage capacitor; and
   a third pixel circuit including:
   a third storage capacitor; and
   at least one transistor electrically connected to the third storage capacitor.

3. The display device of claim 2, wherein the first storage capacitor is disposed between the second storage capacitor and the third storage capacitor.

4. The display device of claim 3, wherein the scan line is disposed between the first storage capacitor and the third storage capacitor.

5. The display device of claim 2, wherein the first to third pixel circuits share the sub-scan line.

6. The display device of claim 2, wherein the light emitting parts include:
   a first light emitting part electrically connected to the first pixel circuit;
   a second light emitting part electrically connected to the second pixel circuit; and
   a third light emitting part electrically connected to the third pixel circuit.

7. The display device of claim 6, wherein the second light emitting part is disposed between the first light emitting part and the third light emitting part.

8. The display device of claim 6, wherein the connection lines include:
   a first connection line electrically connecting the second light emitting part and the second pixel circuit; and
   a second connection line electrically connecting the third light emitting part and the third pixel circuit.

9. The display device of claim 8, wherein the sub-scan line is disposed between the first connection line and the second connection line.

10. The display device of claim 8, wherein
    the first connection line bypasses one end of the sub-scan line, and
    the second connection line bypasses another end of the sub-scan line.

11. The display device of claim 6, wherein the first to third storage capacitors do not overlap the first light emitting part or the third light emitting part in a plan view.

12. The display device of claim 1, wherein the scan line is disposed on the sub-scan line.

13. The display device of claim 1, further comprising:
    a bank including opening areas overlapping the light emitting parts in a plan view.

14. The display device of claim 13, wherein each of the light emitting parts includes:
    a first electrode and a second electrode spaced apart from each other in the first direction in an opening area among the opening areas;
    light emitting elements disposed between the first electrode and the second electrode;
    a first connection electrode electrically connected to one end of the light emitting elements; and
    a second connection electrode electrically connected to another end of the light emitting elements.

15. The display device of claim 14, wherein the first connection electrode is electrically connected to the connection lines through a first contact hole.

16. The display device of claim 15, wherein the first contact hole does not overlap the opening areas in a plan view.

17. The display device of claim 14, wherein the second connection electrode is electrically connected to a power line receiving a driving power source through a second contact hole.

18. The display device of claim 17, wherein the second contact hole does not overlap the opening area in a plan view.

19. The display device of claim 17, wherein the power line extends in the first direction between the pixel circuits.

20. A display device comprising:
pixels, each of the pixels including:
light emitting parts disposed in a first direction;
pixel circuits for respective sub-pixels including storage capacitors disposed in a second direction intersecting the first direction;
a scan line extending in the first direction between the storage capacitors of at least two sub-pixels of a respective one of the pixels, the scan line supplying at least a scan signal to the respective one of the pixels;
a sub-scan line electrically connected to the scan line and extending in the second direction; and
connection lines that electrically connect the light emitting parts and the pixel circuits and do not overlap the sub-scan line in a plan view, wherein
the pixel circuits include a first pixel circuit, a second pixel circuit, and a third pixel circuit, and
the first to third pixel circuits share the sub-scan line.

21. The display device of claim 1, further comprising:
a first data line, a second data line, and a third data line, wherein
the pixel circuits include a first pixel circuit, a second pixel circuit, and a third pixel circuit,
the first data line is electrically connected to the first pixel circuit,
the second data line is electrically connected to the second pixel circuit, and
the third data line is electrically connected to the third pixel circuit.

22. A display device comprising:
pixels, each of the pixels including:
light emitting parts disposed in a first direction;
pixel circuits for respective sub-pixels including storage capacitors disposed in a second direction intersecting the first direction;
a scan line extending in the first direction between the storage capacitors of at least two sub-pixels of a respective one of the pixels, the scan line supplying at least a scan signal to the respective one of the pixels;
a sub-scan line electrically connected to the scan line and extending in the second direction; and
connection lines that electrically connect the light emitting parts and the pixel circuits and do not overlap the sub-scan line in a plan view, wherein
the pixel circuits include a first pixel circuit, a second pixel circuit, and a third pixel circuit, and
the sub-scan line supplies the scan signal to a first transistor of each of the first pixel circuit, the second pixel circuit, and the third pixel circuit, and
the sub-scan line supplies a control signal to a second transistor of each of the first pixel circuit, the second pixel circuit, and the third pixel circuit.

\* \* \* \* \*